US012805360B2

(12) United States Patent
Yu et al.

(10) Patent No.: US 12,805,360 B2
(45) Date of Patent: Nov. 17, 2026

(54) PACKAGE STRUCTURES AND METHODS OF FORMING THE SAME

(71) Applicant: Taiwan Semiconductor Manufacturing Co., Ltd., Hsinchu (TW)

(72) Inventors: Chien-Tung Yu, Hsinchu (TW); Chia-Hsiang Lin, Zhubei (TW); Chi-Pu Lin, New Taipei (TW); Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 1189 days.

(21) Appl. No.: 17/706,313

(22) Filed: Mar. 28, 2022

(65) Prior Publication Data

US 2023/0307338 A1 Sep. 28, 2023

(51) Int. Cl.

| | |
|---|---|
| ***H10W 70/685*** | (2026.01) |
| ***H10W 70/05*** | (2026.01) |
| ***H10W 70/65*** | (2026.01) |
| ***H10W 70/69*** | (2026.01) |
| ***H10W 90/00*** | (2026.01) |

(Continued)

(52) U.S. Cl.

CPC ......... *H10W 70/685* (2026.01); *H10W 70/05* (2026.01); *H10W 70/095* (2026.01); *H10W 70/65* (2026.01); *H10W 70/69* (2026.01); *H10W 90/00* (2026.01); *H10W 90/401* (2026.01); *H10W 70/60* (2026.01); *H10W 72/823* (2026.01); *H10W 74/15* (2026.01); *H10W 90/28* (2026.01); *H10W 90/701* (2026.01); *H10W 90/722* (2026.01); *H10W 90/724* (2026.01);

(Continued)

(58) Field of Classification Search

CPC ................................................ H01L 23/49822

See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |

(Continued)

FOREIGN PATENT DOCUMENTS

| | | | |
|---|---|---|---|
| TW | 201203483 | A | 1/2012 |
| TW | 201919187 | A | 5/2019 |

(Continued)

*Primary Examiner* — Leonard Chang
*Assistant Examiner* — Hajar Kolahdouzan
(74) *Attorney, Agent, or Firm* — Slater Matsil, LLP

(57) ABSTRACT

A method includes forming a redistribution structure, wherein forming the redistribution structure includes forming a first conductive material on a portion of a first seed layer, forming a mask over the first seed layer and the first conductive material, wherein an opening in the mask at least partially exposes the first conductive material, forming a first conductive via in the opening, etching portions of the first seed layer using the first conductive material as an etching mask, depositing a first insulating layer over the first conductive via, the first conductive material and remaining portions of the first seed layer, and etching the first insulating layer such that a portion of the first conductive via protrudes above a top surface of the first insulating layer, and attaching a first die to the redistribution structure using first electrical connectors.

20 Claims, 25 Drawing Sheets

(51) Int. Cl.
*H10W 70/60* (2026.01)
*H10W 72/00* (2026.01)
*H10W 74/15* (2026.01)
*H10W 90/28* (2026.01)

(52) U.S. Cl.
CPC ........ *H10W 90/734* (2026.01); *H10W 90/754* (2026.01)

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 11,152,273 | B2 | 10/2021 | Tu et al. | |
| 11,637,054 | B2 | 4/2023 | Hung et al. | |
| 2012/0012997 | A1 | 1/2012 | Shen et al. | |
| 2020/0043853 | A1* | 2/2020 | Kim | H10P 72/74 |
| 2020/0075470 | A1 | 3/2020 | Kuo et al. | |
| 2020/0176378 | A1* | 6/2020 | Wu | H01L 23/5226 |

FOREIGN PATENT DOCUMENTS

| | | | |
|---|---|---|---|
| TW | 202011556 | A | 3/2020 |
| TW | 202133282 | A | 9/2021 |

* cited by examiner

PACKAGE STRUCTURES AND METHODS OF FORMING THE SAME

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional (3D) package that includes multiple chips. Other packages have also been developed to incorporate 3D aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
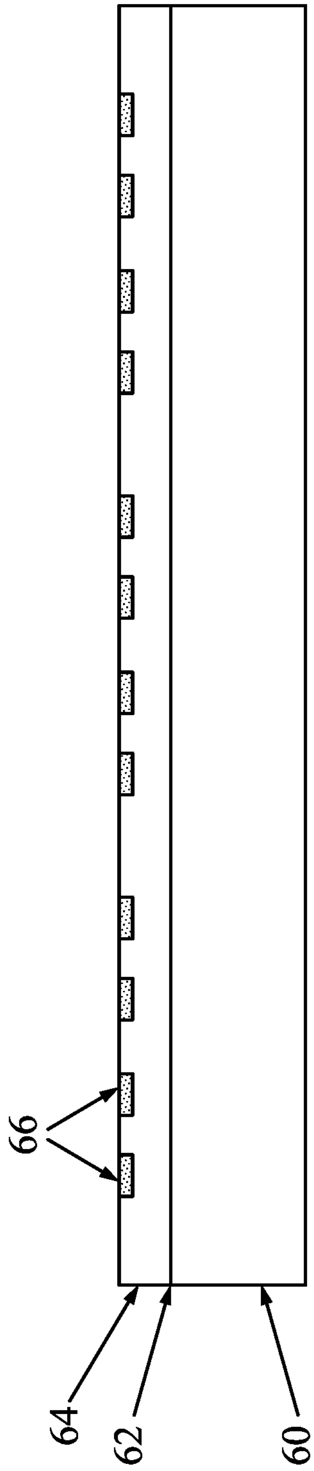
FIGS. 1 through 22 are cross-sectional views in an example process of forming a package structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include methods applied to the formation of a device package (e.g., a chip-on-wafer-on-substrate (CoWoS) package) comprising one or more semiconductor chips bonded to an interposer and a package substrate bonded to a side of the interposer opposing the one or more semiconductor chips. The interposer may include a redistribution structure (e.g., comprising redistribution lines and/or conductive vias disposed in one or more insulating layers) disposed on a semiconductor substrate. The redistribution structure may be formed by the methods that include forming a patterned photoresist over a first conductive feature and forming a conductive via in the patterned photoresist over the first conductive feature. The photoresist is removed and a polyimide layer is coated over the conductive via and the first conductive feature. The polyimide layer is etched to expose a top surface of the conductive via and a second conductive feature is then formed over the conductive via and the etched polyimide layer. One or more embodiments disclosed herein may include allowing the conductive via to have a smaller width and a larger height (e.g., having a higher aspect ratio), which allows for a higher routing density that is suitable for high-speed transmission, high capacity bandwidth, and high speed computing applications. In addition, the polyimide layer can be formed to a greater thickness, which increases the reliability of the device package and helps to prevent resistive-capacitive (RC) delay during operation. In addition, the greater thickness of the polyimide layer enhances the stability of the device package.

Embodiments will be described with respect to a specific context, namely a Die-Interposer-Substrate stacked package using Chip-on-Wafer-on-Substrate (CoWoS) processing. Other embodiments may also be applied, however, to other packages, such as a Die-Die-Substrate stacked package, a System-on-Integrated-Chip (SoIC) device package, an Integrated Fan-Out (InFO) package, and other processing. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

FIG. 1 illustrates one or more dies 68. A main body 60 of the dies 68 may comprise any number of dies, substrates, transistors, active devices, passive devices, or the like. In an embodiment, the main body 60 may include a bulk semiconductor substrate, semiconductor-on-insulator (SOI) substrate, multi-layered semiconductor substrate, or the like. The semiconductor material of the main body 60 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The main body 60 may be doped or undoped. Devices, such as transistors, capacitors, resistors, diodes, and the like, may be formed in and/or on an active surface 62 of the main body 60.

An interconnect structure 64 comprising one or more dielectric layer(s) and respective metallization pattern(s) is formed on the active surface 62. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, die connectors 66, such as conductive pillars (for example, comprising a metal such as copper), are formed in and/or on the interconnect structure 64 to provide an external electrical connection to the circuitry and devices. In some embodiments, the die connectors 66 protrude from the interconnect structure 64 to form pillar structure to be utilized when bonding the dies 68 to other structures. One of ordinary skill in the art will appreciate that the above examples are provided for illustrative purposes. Other circuitry may be used as appropriate for a given application.

More particularly, an inter-metallization dielectric (IMD) layer may be formed in the interconnect structure 64. The IMD layer may be formed, for example, of a low-K dielectric material, such as phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma chemical vapor deposition (HDP-CVD), or the like. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. The recesses and/or openings may be lined with a diffusion barrier layer and filled with a conductive material. The diffusion barrier layer may comprise one or more layers of tantalum nitride, tantalum, titanium nitride, titanium, cobalt tungsten, the like, or a combination thereof, deposited by atomic layer deposition (ALD), or the like. The conductive material of the metallization patterns may comprise copper, aluminum, tungsten, silver, and combinations thereof, or the like, deposited by CVD, physical vapor deposition (PVD), or the like. Any excessive diffusion barrier layer and/or conductive material on the IMD layer may be removed, such as by using a chemical mechanical polish (CMP).

Figure 2:
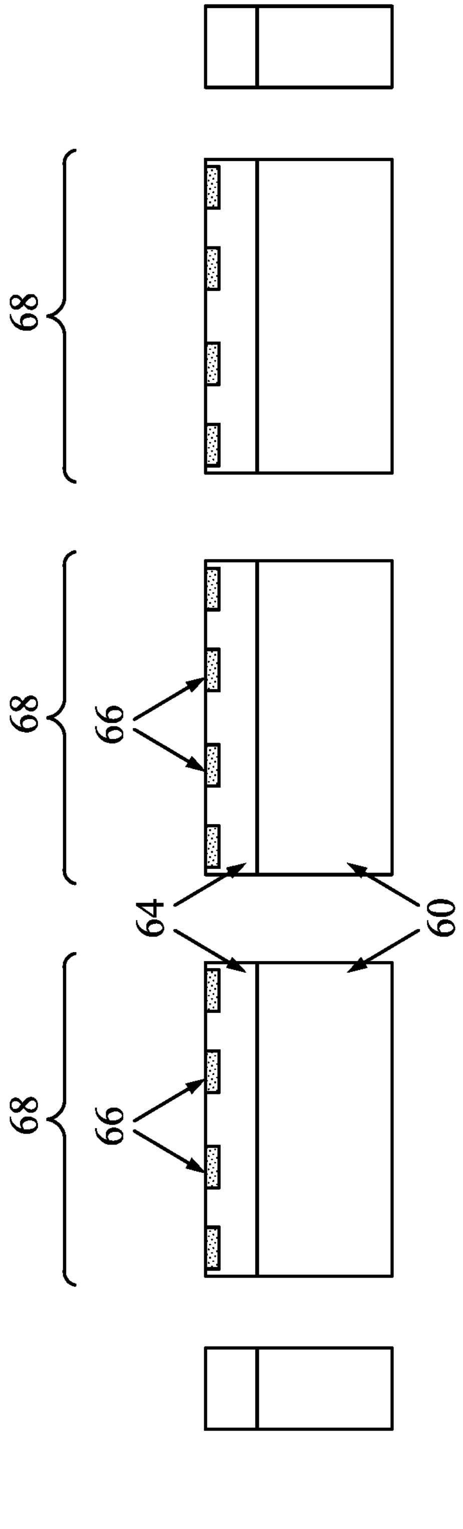

In FIG. 2, the main body 60 including the interconnect structure 64 is singulated into individual dies 68. Typically, the dies 68 contain the same circuitry, such as devices and metallization patterns, although the dies may have different circuitry. The singulation may include sawing, dicing, or the like.

Each of the dies 68 may include one or more logic dies (e.g., central processing unit, graphics processing unit, system-on-a-chip, field-programmable gate array (FPGA), microcontroller, or the like), memory dies (e.g., dynamic random access memory (DRAM) die, static random access memory (SRAM) die, or the like), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the dies 68 may be different sizes (e.g., different heights and/or surface areas), and in other embodiments, the dies 68 may be the same size (e.g., same heights and/or surface areas).

FIGS. 3 through 12 illustrate the formation of a redistribution structure 93 (see FIG. 12) over a first surface 72 of a substrate 70. The redistribution structure 93 may include one or more dielectric layer(s) and respective metallization pattern(s) in the dielectric layer(s). The metallization patterns may comprise vias and/or traces to interconnect any devices and/or through-vias (TVs) 74 (described below) together and/or to an external device. The metallization patterns are sometimes referred to as Redistribution Lines (RDLs).

Figure 3:
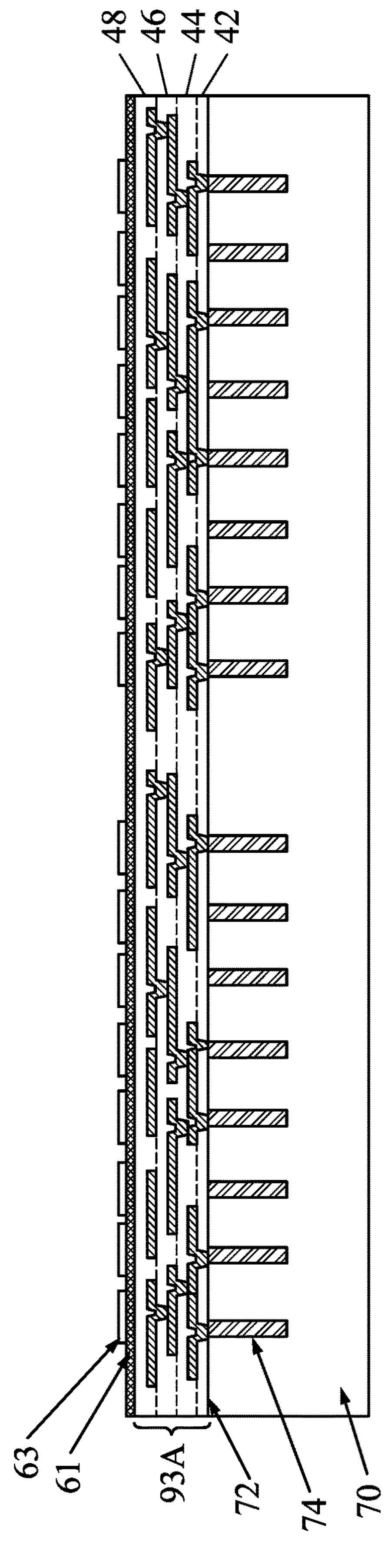

FIG. 3 illustrates the substrate 70, which comprises one or more components 96 during processing. The components 96 may be an interposer or another die. The substrate 70 can be a wafer. The substrate 70 may comprise a bulk semiconductor substrate, SOI substrate, multi-layered semiconductor substrate, or the like. The semiconductor material of the substrate 70 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 70 may be doped or undoped. In some embodiments, devices, such as transistors, capacitors, resistors, diodes, and the like, may be formed in and/or on a first surface 72, which may also be referred to as an active surface, of the substrate 70. In some embodiments where component 96 is an interposer, component 96 will not include active devices therein, although the interposer may include passive devices formed in and/or on a first surface 72. In such embodiments, the component 96 may be free of any active devices on the substrate 70.

Through-vias (TVs) 74 are formed to extend from the first surface 72 of substrate 70 into substrate 70. The TVs 74 are also sometimes referred to as through-substrate vias or through-silicon vias when substrate 70 is a silicon substrate. The TVs 74 may be formed prior to forming the redistribution structure 93. In some embodiments, the TVs 74 may be formed by forming recesses in the substrate 70 by, for example, etching, milling, laser techniques, a combination thereof, and/or the like. A thin dielectric material may be formed in the recesses, such as by using an oxidation technique. A thin barrier layer may be conformally deposited over the front side of the substrate 70 and in the openings, such as by CVD, ALD, PVD, thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the front side of the substrate 70 by, for example, CMP. Thus, the TVs

74 may comprise a conductive material and a thin barrier layer between the conductive material and the substrate 70.

Still referring to FIG. 3, an optional first redistribution portion 93A of the redistribution structure 93 may be formed over the first surface 72 of the substrate 70. The first redistribution portion 93A maybe formed prior to forming a second redistribution portion 93B (shown subsequently in FIG. 12) of the redistribution structure 93. In some embodiments, the first redistribution portion 93A of the redistribution structure may be omitted and only the second redistribution portion 93B is formed.

The first redistribution portion 93A may comprise insulating layers (e.g., insulating layer 42, insulating layer 44, insulating layer 46, and insulating layer 48), and metallization patterns within each of the insulating layers. In some embodiments, the first redistribution portion 93A may have any number of insulating layers or metallization patterns.

Each of the insulating layers 42, 44, 46, or 48 may comprise, for example, a low-K dielectric material, such as phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method known in the art, such as spinning, chemical vapor deposition (CVD), plasma-enhanced CVD (PECVD), high-density plasma chemical vapor deposition (HDP-CVD), or the like. A metallization pattern may then be formed in the insulating layer, for example, by using photolithography techniques to deposit and pattern a photoresist material on the insulating layer to expose portions of the insulating layer that are to become the metallization pattern. An etch process, such as an anisotropic dry etch process, may be used to create recesses and/or openings in the insulating layer corresponding to the exposed portions of the insulating layer. The recesses and/or openings may be lined with a diffusion barrier layer and filled with a conductive material. The diffusion barrier layer may comprise one or more layers of tantalum nitride, tantalum, titanium nitride, titanium, cobalt tungsten, the like, or a combination thereof, deposited by atomic layer deposition (ALD), or the like. The conductive material of the metallization patterns may comprise copper, aluminum, tungsten, silver, and combinations thereof, or the like, deposited by CVD, physical vapor deposition (PVD), or the like. Any excessive diffusion barrier layer and/or conductive material on the insulating layer may be removed, such as by using a chemical mechanical polish (CMP).

Further referring to FIG. 3, a seed layer 61 is formed over the first redistribution portion 93A. In embodiments where the first redistribution portion 93A is not formed, the seed layer 61 is formed over the first surface 72 of the substrate 70. The seed layer 61 may comprise one or more thin layers of a conductive material that aids in the formation of a thicker layer during subsequent processing steps. The seed layer 61 may comprise a layer of titanium formed using processes such as sputtering, evaporation, PECVD, or the like. A suitable mask, such as a photoresist (not shown) may then be formed and patterned to cover the seed layer 61 using, e.g., a spin coating technique. Once the photoresist has been formed and patterned, a conductive material 63 may be formed on the seed layer 61. The conductive material 63 may be a material such as copper, gold, cobalt, nickel, silver, titanium, tungsten, aluminum, another metal, the like, or a combination thereof. In other embodiments, the conductive material 63 may comprise graphene. The conductive material 63 may be formed through a deposition process such as electroplating, electroless plating, or the like. Once the conductive material 63 has been formed, the photoresist may be removed through a suitable removal process such as ashing or chemical stripping. As shown subsequently in FIG. 5, the conductive material 63 and the underlying portions of the seed layer 61 below the conductive material 63 form conductive features 59 (which may also be referred to as conductive pads subsequently) of the redistribution structure 93.

Figure 4:
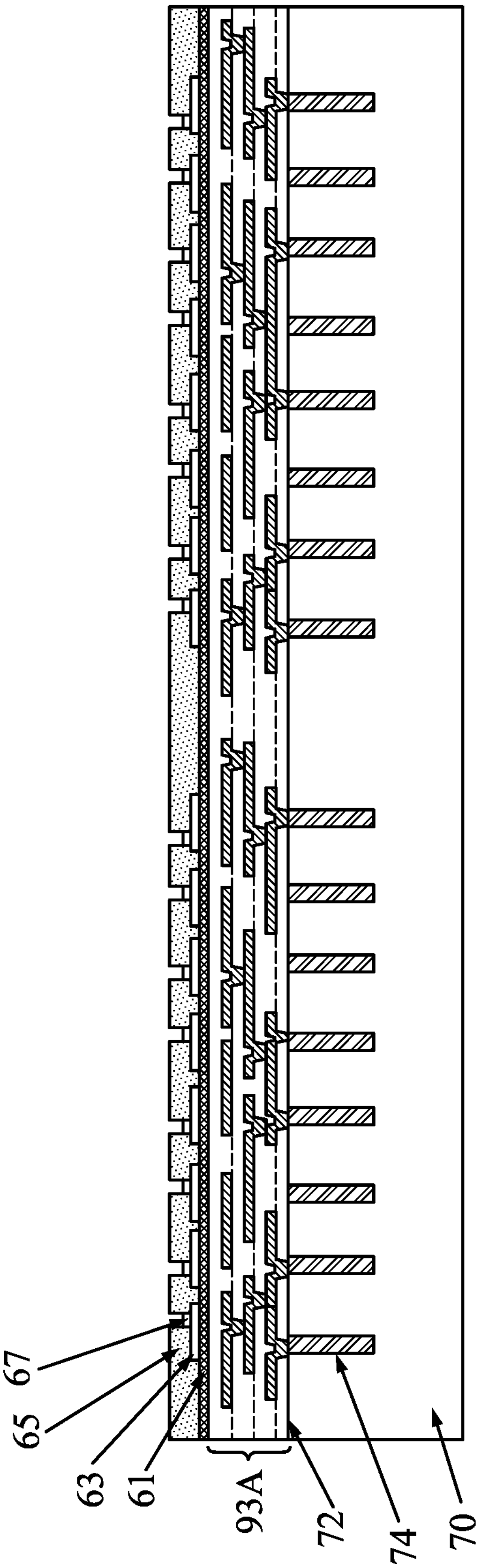

FIG. 4 illustrates the formation of conductive vias 67 on the conductive material 63. A photoresist 65 is formed to cover the seed layer 61 and the conductive material 63 using, e.g., a spin coating technique. The photoresist 65 is then patterned (e.g., through a combination of exposure and development) to form openings in the photoresist 65 that expose the conductive material 63. Once the openings have been formed, a descum process is performed to remove mask residues (e.g., from the photoresist 65) from top surfaces of the conductive material 63. The descum process may comprise using process gases such as $CF_4$, $O_2$, or the like. Conductive vias 67 are then formed within the openings in the photoresist 65 using a plating process to deposit a conductive material such as copper, aluminum, titanium, combinations of these, or the like. The plating process may be an electroplating process or an electroless plating process that forms the conductive vias 67 on top surfaces of the conductive material 63 without the need to form an additional seed layer on the conductive material 63 prior to the plating process.

Figure 5:
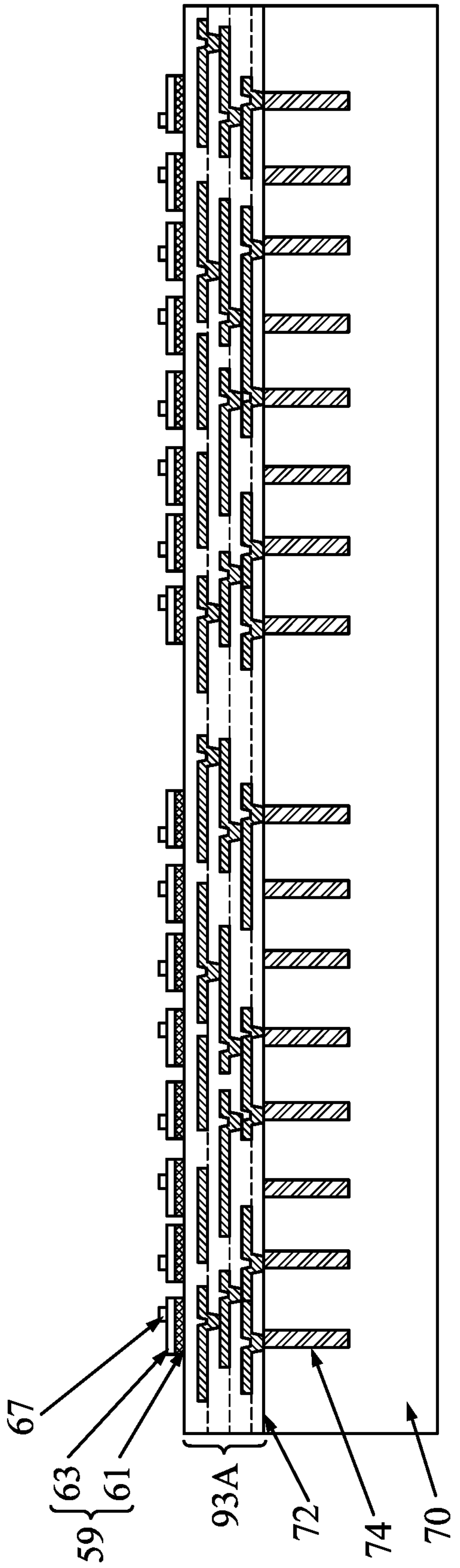

In FIG. 5, the photoresist 65 is removed through a suitable removal process such as ashing or chemical stripping. After the removal of the photoresist, portions of the seed layer 61 are removed through, for example, a suitable wet etch process or dry etch process, which may use the conductive material 63 as an etch mask. The remaining portions of the seed layer 61 and the conductive material 63 form the conductive features 59 of the second redistribution portion 93B. The conductive vias 67 may have different profiles as a result of the wet etch process or dry process. In an embodiment, plasma dry etching may be used to remove the portions of the seed layer 61, and this results in the conductive vias 67 having a profile that is described subsequently in FIG. 7B. In an embodiment, plasma dry etching may be used to remove the portions of the seed layer 61, and this results in the conductive vias 67 having a profile that is described subsequently in FIG. 7B. In an embodiment, wet chemical etching may be used to remove the portions of the seed layer 61, and this results in the conductive vias 67 having a profile that is described subsequently in FIG. 7C.

Figure 6:
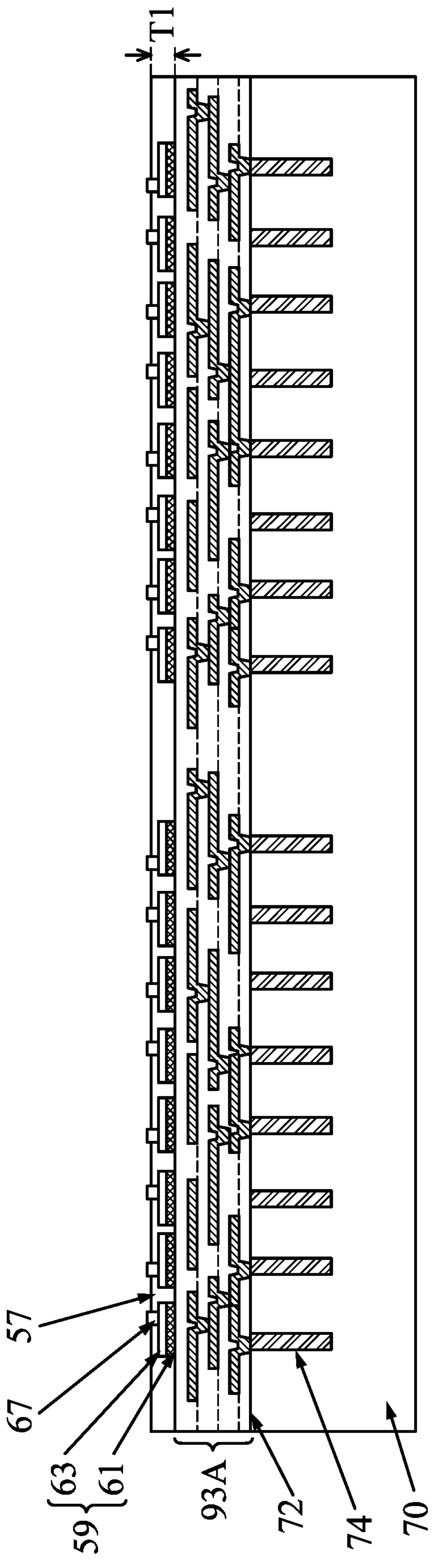

FIG. 6 illustrates the formation of an insulating layer 57 over the conductive features 59, the conductive vias 67, and the substrate 70. The insulating layer 57 may comprise one or more dielectric materials such as a polyimide material, another dielectric material, or the like. The insulating layer 57 may be formed by a process such as spin coating, slit coating, or the like, after which a suitable curing process may be performed on the insulating layer 57. Because conductive vias 67 are formed prior to forming the insulating layer 57, the thickness of the insulating layer 57 does not affect the shape, height, or dimensions of the conductive vias 67. After the formation of the insulating layer 57, an etch back process is performed on the insulating layer 57 to expose top surfaces of the conductive vias 67. The etch back process may comprise a suitable etching process such as plasma etching, or the like, that includes a combination of plasmas that are derived from $CF_4$ and $O_2$ gases. In an embodiment, after the etch back process, portions of the conductive vias 67 protrude above a top surface of the insulating layer 57. In an embodiment, minor etching of the protruding portions (e.g., sidewalls) of the conductive vias 67 may occur during the plasma etching process. In other embodiments (not shown in FIG. 6), after the etch back process, top surfaces of the conductive vias 67 are level with the top surface of the insulating layer 57. After the etch back process a thickness T1 of the insulating layer 57 may be in a range from 5 μm to 15 μm. In an embodiment, the thickness T1 of the insulating layer 57 may be greater than 10 μm.

Figure 7A:
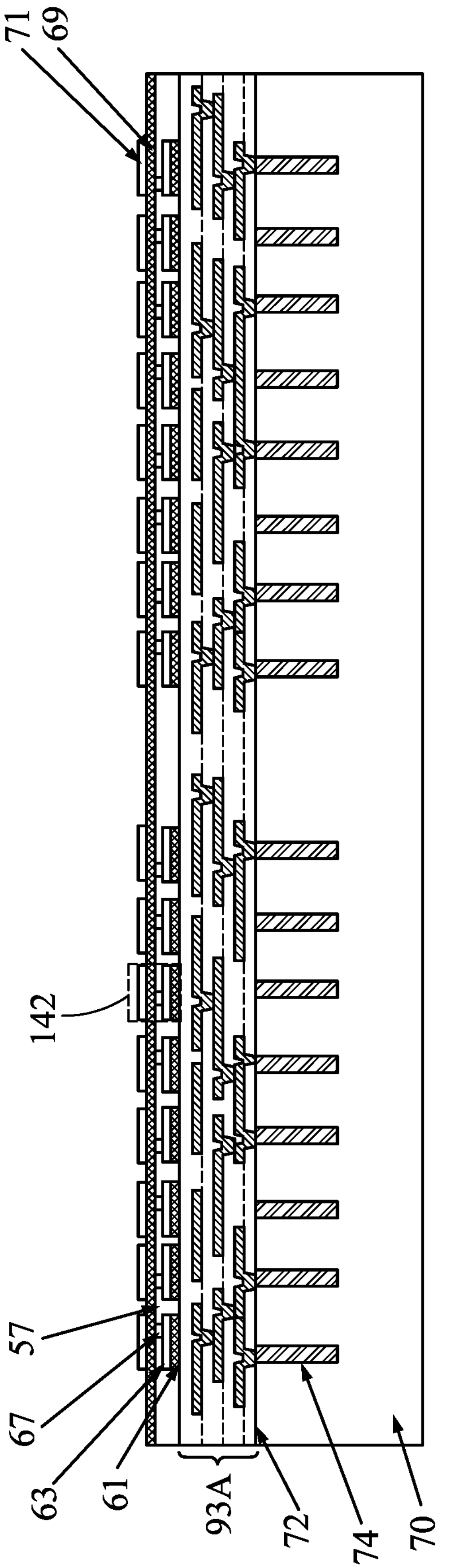

In FIGS. 7A through 12, additional insulating layers 81 and 89, conductive features 55 (which may also be referred to as redistribution line (RDL)), conductive vias 73, and conductive features 53 (which may also be referred to as conductive pads subsequently) of the second redistribution portion 93B are then formed over the insulating layer 57 and conductive vias 67. In FIG. 7A, a seed layer 69 is formed over the insulating layer 57 and conductive vias 67. The seed layer 69 may be formed in a similar manner and may comprise the same materials as the seed layer 61 described previously in FIG. 3.

After the formation of the seed layer 69, a photoresist is formed and patterned on top of the seed layer 69 in a desired pattern for the conductive features 55 (shown subsequently in FIG. 9), and conductive material 71 may then be formed in the patterned openings of the photoresist using a similar process as that used to form the conductive material 63 (described previously in FIG. 3). The conductive material 71 may comprise the same materials as the conductive material 63. Once the conductive material 71 has been formed, the photoresist may be removed through a suitable removal process such as ashing or chemical stripping. As shown subsequently in FIG. 9, the conductive material 71 and the underlying portions of the seed layer 69 below the conductive material 71 form the conductive features 55 of the second distribution portion 93B.

Figure 7C:
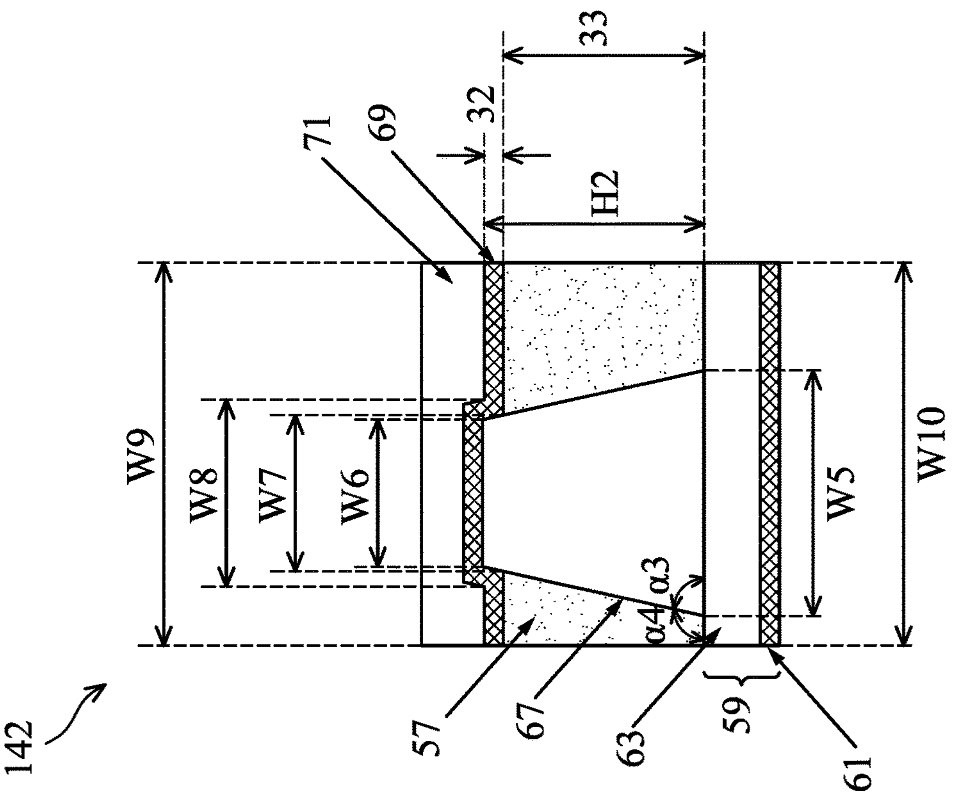
Figure 7B:
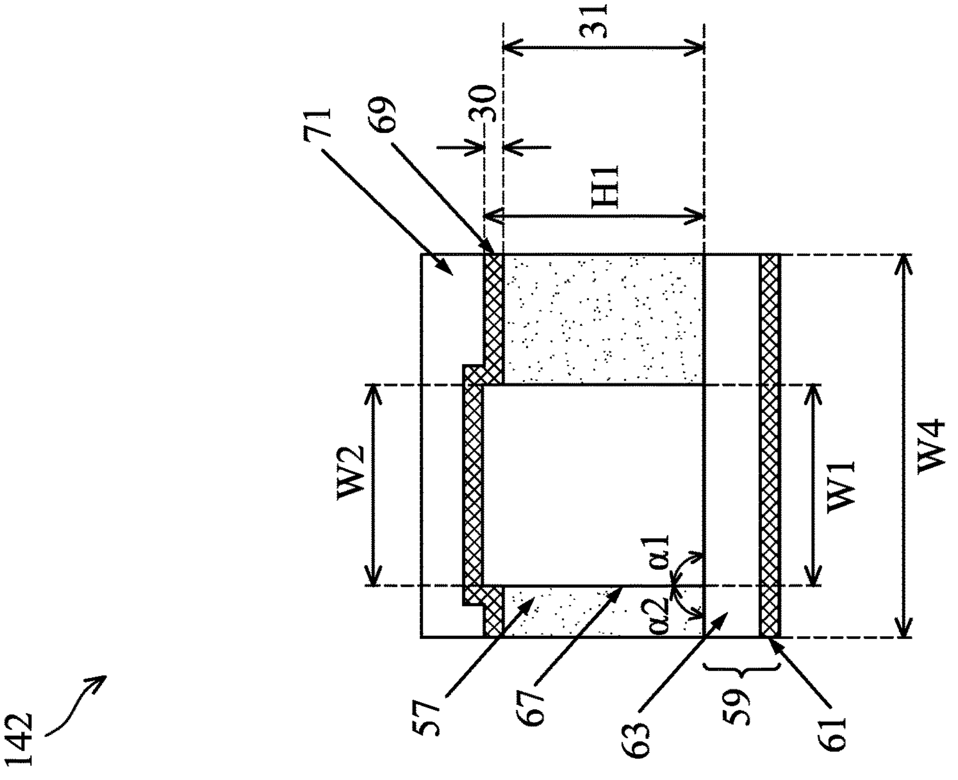
Figure 7D:
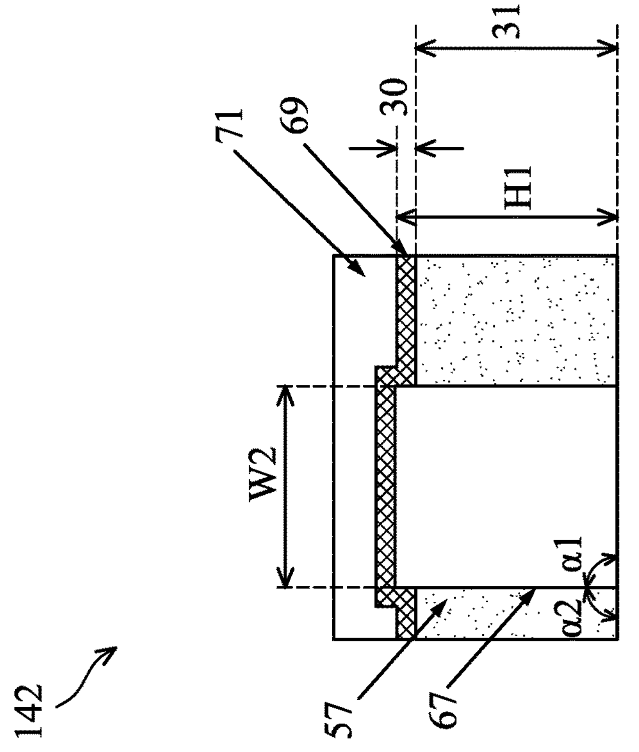
Figure 9:
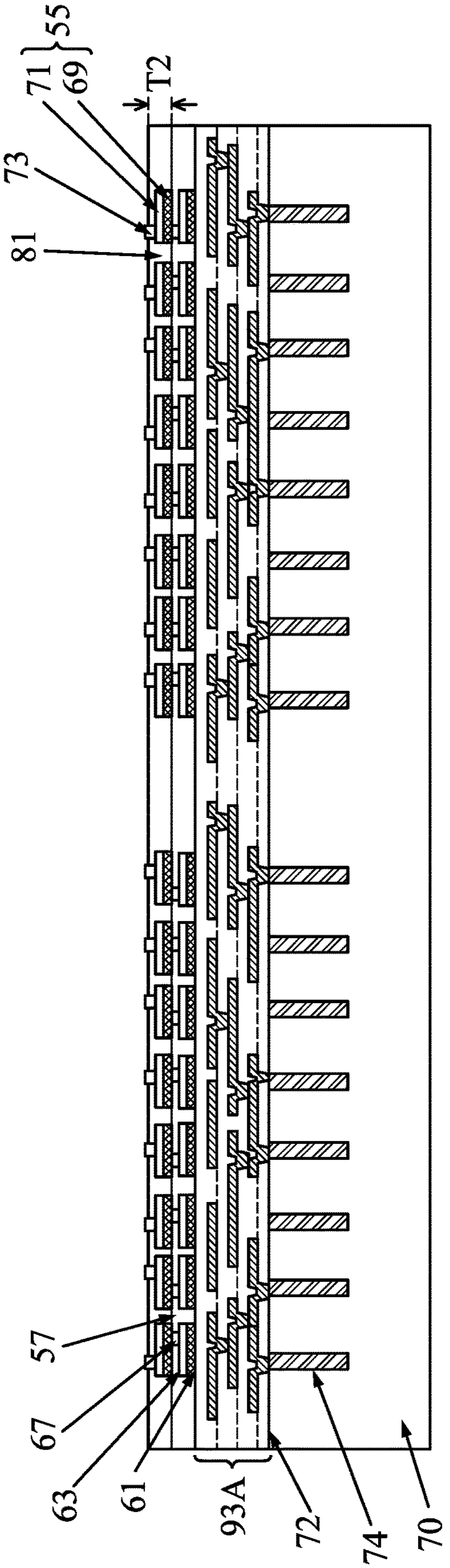

FIG. 7B illustrates a detailed view of a region 142 of FIG. 7A. FIG. 7B shows the conductive via 67 on the conductive feature 59. In addition, the conductive material 71 and underlying seed layer 69 (which subsequently form the conductive features 55 as shown in FIG. 9) are on the conductive via 67. In an embodiment, the conductive via 67 may have vertical sidewalls in which an inner angle α1 of a bottom corner of the conductive via 67 is equal to 90°. In an embodiment, an angle α2 between a surface of the insulating layer 57 that is in contact with a sidewall of the conductive via 67 and a surface of the insulating layer 57 that is in contact with a top surface of the conductive feature 59 is equal to 90°. In an embodiment, a height H1 from a topmost surface of the conductive via 67 to a bottom surface of the conductive via 67 may be in range from 5 μm to 15 μm. In an embodiment, the conductive via 67 may comprise an upper portion 30 and a lower portion 31, where the upper portion 30 is above the lower portion 31. The upper portion 30 may extend above a top surface of the insulating layer 57, and the lower portion 31 may extend through the insulating layer 57. In some embodiments, the top surface of the conductive via 67 may be higher than both the bottom surface of the conductive material 71 and the top surface of the insulating layer 57 as shown in FIG. 7D. In an embodiment, a width W1 of the bottom surface of the conductive via 67 may be less than 1 μm, such as in a range from 0.8 μm to 10 μm. In an embodiment, a top surface of the upper portion 30 of the conductive via 67 may have a width W2, wherein the width W2 is smaller than the width W1. In an embodiment, the width W2 may be in a range from 0.6 μm to 9 μm. In an embodiment, the upper portion 30 of the conductive via 67 may have a uniform width that is equal to the width W2 and the lower portion 31 of the conductive via 67 may have a uniform width that is equal to the width W1. In an embodiment, the upper portion 30 and the lower portion 31 may have the same width, where the width W1 is equal to the width W2. In an embodiment in which the conductive via 67 has a uniform width from a topmost surface of the conductive via 67 to a bottommost surface of the conductive via 67, the seed layer 69 is in physical contact with only a top surface and sidewalls of the upper portion 30 of the conductive via 67. In other embodiments, the seed layer 69 is in physical contact with a top surface and sidewalls of the upper portion 30 of the conductive via 67 as well as top surfaces of the lower portion 31 of the conductive via 67 (not shown in the Figure). In an embodiment, the conductive material 71 may have a line width W3 that is in a range from 0.6 μm to 9 μm, wherein the line width W3 is perpendicular to the width W2 when observed in a top-down view. In an embodiment, the conductive feature 59 may have a width W4 that may be in a range from 1.2 μm to 12 μm.

Advantages may be achieved as a result of the formation of the second redistribution portion 93B by methods that include forming the photoresist 65 over the conductive material 63 and forming the conductive via 67 in the photoresist 65 over the conductive material 63. The photoresist 65 is removed and the insulating layer 57 is coated over the conductive via 67 and the conductive material 63. The insulating layer 57 is etched to expose a top surface of the conductive via 67 and the conductive feature 55 is then formed over the conductive via 67 and the etched insulating layer 57. These advantages include reduced shrinkage of the insulating layer 57 during a subsequent curing process as a result of the conductive via 67 being formed prior to the formation of the insulating layer 57. This allows the conductive via 67 to be formed having a smaller width and a larger height (e.g., having a higher aspect ratio), as well as allowing the conductive feature 59 to have a smaller width This further allows for a higher routing density that is suitable for high-speed transmission, high capacity bandwidth, and high speed computing applications. In addition, the insulating layer 57 can be formed to a greater thickness, which increases device reliability and helps to prevent resistive-capacitive (RC) delay during operation. Further, a greater thickness of the insulating layer 57 will enhance device package structural stability.

Figure 7E:
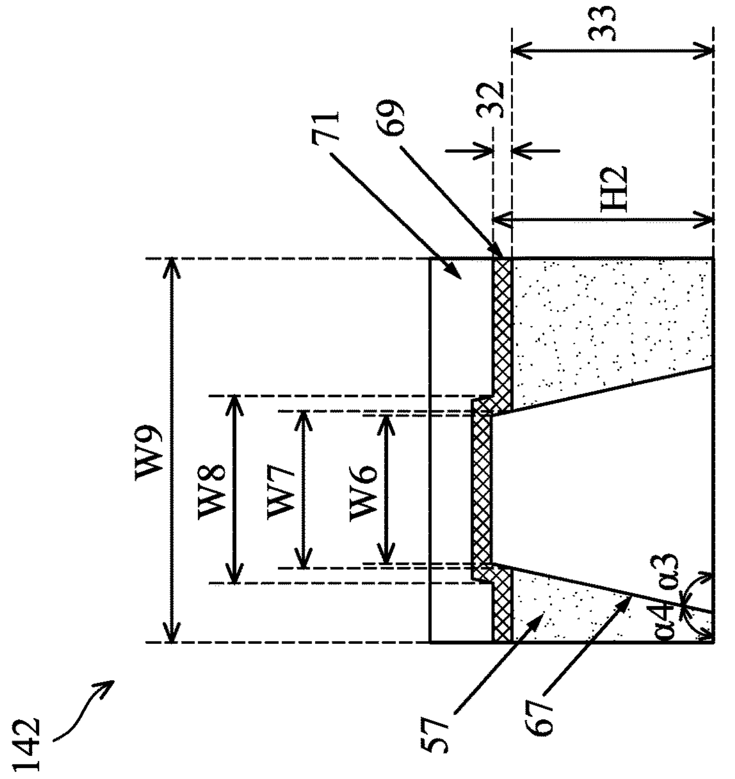

FIG. 7C illustrates an alternative embodiment that shows a detailed view of the region 142 in FIG. 7A. Unless specified otherwise, like reference numerals in this embodiment (and subsequently discussed embodiments) represent like components in the embodiment shown in FIGS. 1A through 7A formed by like processes. Accordingly, the process steps and applicable materials may not be repeated herein. FIG. 7C shows the conductive via 67 on the conductive feature 59. In addition, the conductive material 71 and underlying seed layer 69 (which subsequently form the conductive feature 55 as shown in FIG. 9) are on the conductive via 67. In an embodiment, the conductive via 67 may have a trapezoid shape with a top surface of the conductive via 67 and an interface between the conductive via 67 and the conductive feature 59 being parallel to each other, where a width of the conductive via 67 decreases in a direction from the conductive feature 59 towards the conductive material 71, and wherein a topmost surface of the conductive via 67 has a smaller width than a bottommost surface of the conductive via 67. In an embodiment, an inner angle α3 of a bottom corner of the conductive via 67 is smaller than 90°. In an embodiment, an angle α4 between a surface of the insulating layer 57 that is in contact with a sidewall of the conductive via 67 and a surface of the insulating layer 57 that is in contact with a top surface of the conductive feature 59 is greater than 90°. For example, the angle α3 may be in a range from 80° to 90°, and the angle α4 may be in a range from 100° to 90°. In an embodiment, a height H2 from a topmost surface of the conductive via 67 to a bottom surface of the conductive via 67 may be in range from 5 μm to 15 μm. In an embodiment, a bottommost width W5 of the conductive via 67 may be less than 1 μm, such as in a range from 0.8 μm to 10 μm. In an embodiment, a width W6 of a topmost surface of the conductive via 67 may be smaller than the width W5 and may further be in a range from 0.6 μm to 9 μm. In an embodiment, the conductive via 67 may comprise an upper portion 32 and a lower portion 33, wherein the upper portion 32 is above the lower portion 33 of the conductive via 67. The upper portion 32 may extend above a top surface of the insulating layer 57, and the lower portion 33 may extend through the insulating layer 57. In some embodiments, the top surface of the conductive via 67 may be higher than both the bottom surface of the conductive material 71 and the top surface of the insulating layer 57 as shown in FIG. 7E. In an embodiment, the upper portion 32 of the conductive via 67 has a bottommost width W7, wherein the width W6 is smaller than the width W7. In an embodiment, a topmost surface of the seed layer 69 that overlaps the conductive via 67 has a width W8, wherein the width W8 is smaller than the width W5, and wherein the width W8 is larger than the width W7. In an embodiment, the width W8 may be in a range from 0.6 μm to 9 μm. In an embodiment, the seed layer 69 is in physical contact with the top surface and sidewalls of the upper portion 32 of the conductive via 67. In an embodiment, the conductive material 71 may have a line width W9 that is in a range from 1.2 μm to 12 μm, wherein the line width W9 is perpendicular to the width W6 when observed in a top-down view. In an embodiment, the conductive feature 59 may have a width W10 that may be in a range from 1.2 μm to 12 μm.

Advantages can be achieved as a result of the formation of the second redistribution portion 93B by methods that include forming the photoresist 65 over the conductive material 63 and forming the conductive via 67 in the photoresist 65 over the conductive material 63. The photoresist 65 is removed and the insulating layer 57 is coated over the conductive via 67 and the conductive material 63. The insulating layer 57 is etched to expose a top surface of the conductive via 67 and the conductive feature 55 is then formed over the conductive via 67 and the etched insulating layer 57. The conductive via 67 has a trapezoid shape and the width of the conductive via 67 decreases in a direction from the conductive feature 59 towards the conductive feature 55 (for example, the width of the conductive via 67 may decrease in a direction from the substrate 70 towards the subsequently attached dies 68 and dies 88 (shown in FIG. 14) such that an inner angle α3 of a bottom corner of the conductive via 67 is smaller than 90°. These advantages include reduced shrinkage of the insulating layer 57 during a subsequent curing process as a result of the conductive via 67 being formed prior to the formation of the insulating layer 57. This allows the conductive via 67 to be formed having a smaller width and a larger height (e.g., having a higher aspect ratio), as well as allowing the conductive feature 59 and conductive feature 55 to have smaller widths. This further allows for a higher routing density that is suitable for high-speed transmission, high capacity bandwidth, and high speed computing applications. In addition, the insulating layer 57 can be formed to a greater thickness, which increases device reliability and helps to prevent resistive-capacitive (RC) delay during operation. Further, a greater thickness of the insulating layer 57 will enhance device package structural stability.

Figure 8:
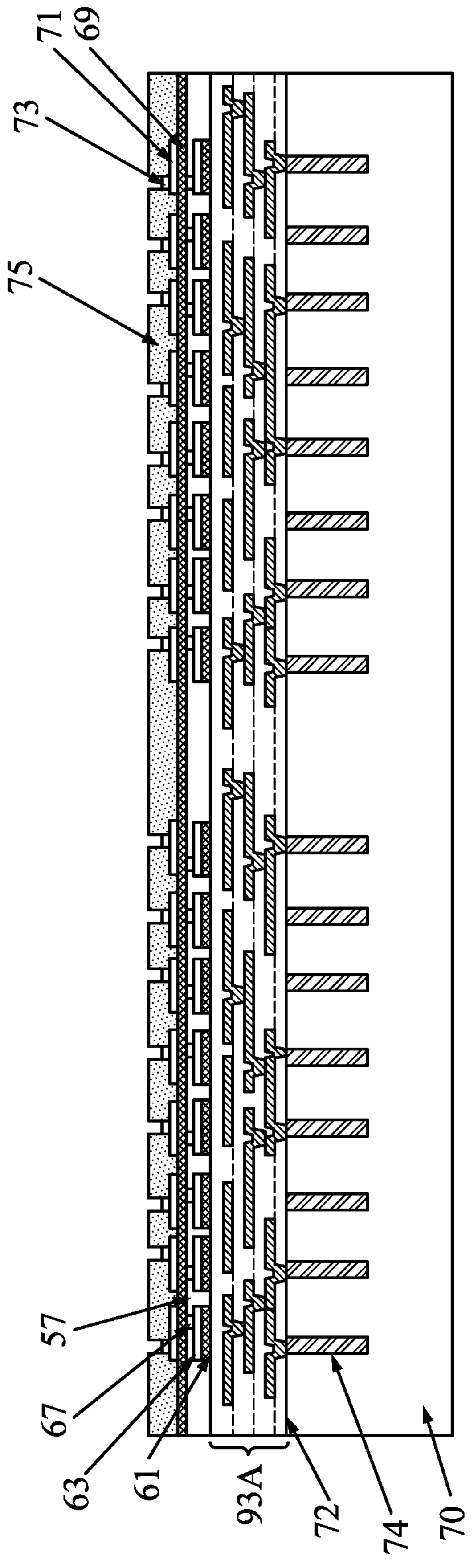

FIG. 8 illustrates the formation of conductive vias 73 on the conductive material 71. A photoresist 75 is formed to cover the seed layer 69 and the conductive material 71 using, e.g., a spin coating technique. The photoresist 75 is then patterned to form openings in the photoresist 75, and the conductive vias 73 are formed in the openings using similar processes and comprising similar materials as the conductive vias 67 (described previously in FIG. 4).

In FIG. 9, the photoresist 75 is removed through a suitable removal process such as ashing or chemical stripping. After the removal of the photoresist, portions of the seed layer 69 are removed through, for example, a suitable wet etch process or dry etch process, which may use the conductive material 71 as an etch mask. The remaining portions of the seed layer 69 and the conductive material 71 form the conductive features 55 of the second redistribution portion 93B.

Still referring to FIG. 9, an insulating layer 81 is formed over the conductive features 55, the substrate 70, conductive vias 73, and insulating layer 57. The insulating layer 81 may be formed using similar processes and may comprise similar materials as the insulating layer 57 described previously in FIG. 6. After the formation of the insulating layer 57, an etch back process similar to the etch back process described previously in FIG. 6 is performed on the insulating layer 81 so as to expose top surfaces of the conductive vias 73. In an embodiment, after the etch back process, portions of the conductive vias 73 protrude above a top surface of the insulating layer 81. In an embodiment, after the etch back process, portions of the conductive vias 67 protrude above a top surface of the insulating layer 57. In an embodiment, minor etching of the protruding portions (e.g., sidewalls) of the conductive vias 73 may occur during the plasma etching process. In other embodiments (not shown in FIG. 9), after the etch back process, top surfaces of the conductive vias 73 are level with the top surface of the insulating layer 81. After the etch back process a thickness T2 of the insulating layer 81 may be in a range from 5 μm to 15 μm. In an embodiment, the thickness T2 of the insulating layer 81 may be greater than 10 μm.

Figure 10:
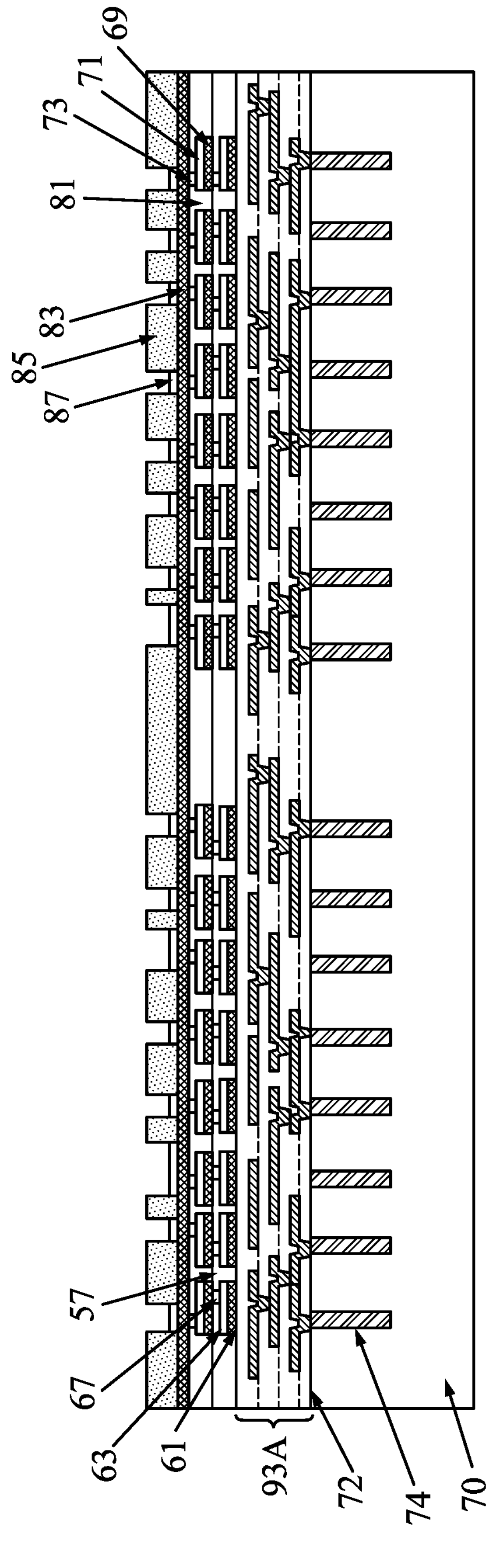

In FIG. 10, a seed layer 83 is formed over the insulating layer 81 and conductive vias 73. The seed layer 83 may be formed in a similar manner and may comprise the same materials as the seed layer 61 and seed layer 69 described previously in FIGS. 3 and 7A, respectively. After the formation of the seed layer 83, a photoresist 85 is formed and patterned on top of the seed layer 83 in a desired pattern for the conductive features 53 (shown subsequently in FIG. 11), and conductive material 87 may then be formed in the patterned openings of the photoresist using a similar process as that used to form the conductive material 63 and the conductive material 71 that were described previously in FIG. 3 and FIG. 7A, respectively. The conductive material 87 may comprise the same materials as the conductive material 63 and the conductive material 71.

Figure 11:
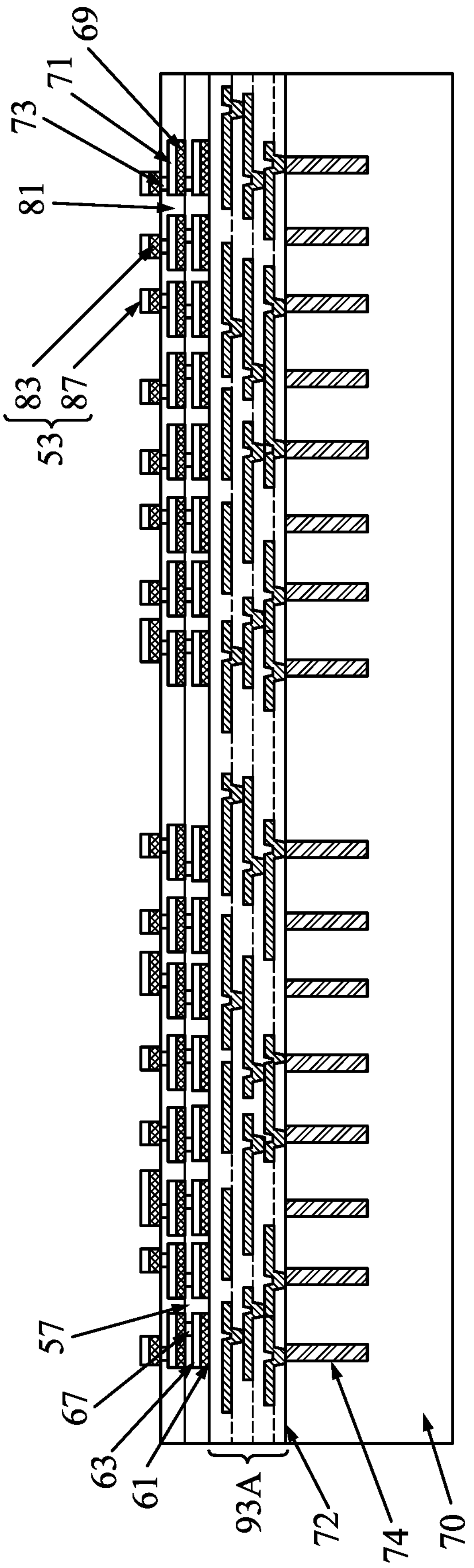

In FIG. 11, the photoresist 85 may be removed through a suitable removal process such as ashing or chemical stripping. After the removal of the photoresist, portions of the seed layer 83 are removed through, for example, a suitable wet etch process or dry etch process, which may use the conductive material 87 as an etch mask. The remaining portions of the seed layer 83 and the conductive material 87 form the conductive features 53 of the second redistribution portion 93B (shown subsequently in FIG. 12). The shape, dimensions and configuration of the conductive features 53, the conductive vias 73, the insulating layer 81, and the conductive features 55 is similar to that of the conductive feature 59, the conductive via 67, the insulating layer 57 and the conductive features 55 that was described previously in FIGS. 7B and 7C.

Figure 12:
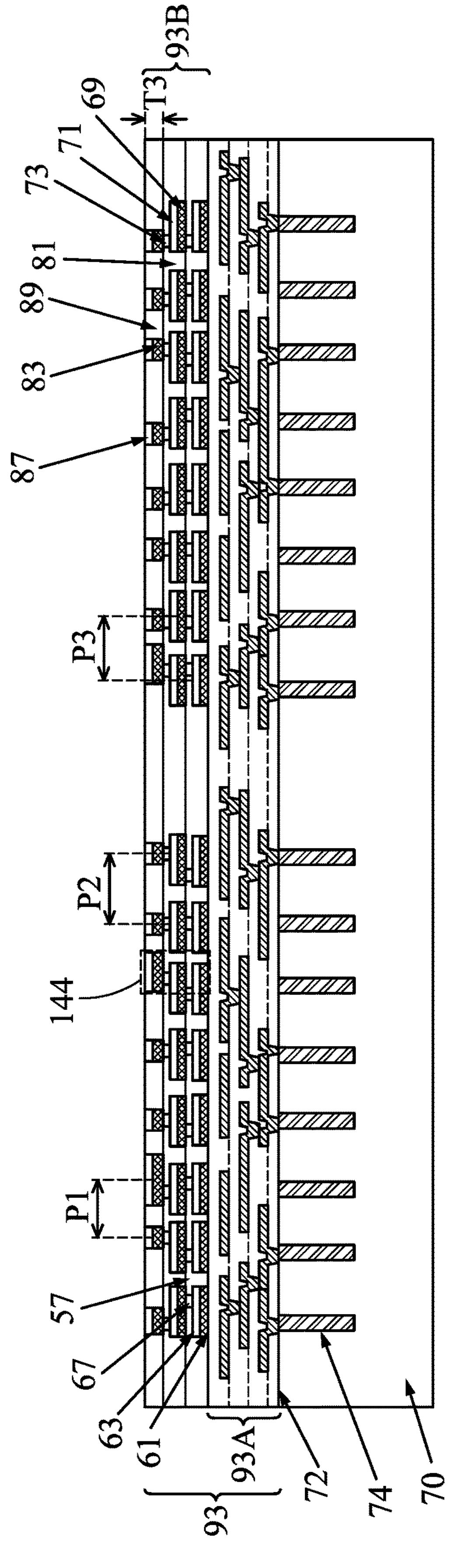

In FIG. 12, an insulating layer 89 is formed over the conductive features 53, the substrate 70, and the insulating layer 81. The insulating layer 89 may be formed using similar processes and may comprise similar materials as the insulating layer 57 and the insulating layer 81 described previously in FIG. 6 and FIG. 9, respectively. After the formation of the insulating layer 89, an etch back process similar to the etch back process described previously in FIG. 6 and FIG. 9 is performed on the insulating layer 89 so as to expose top surfaces of the conductive features 53. In an embodiment, after the etch back process, top surfaces of the conductive features 53 are level with a top surface of the insulating layer 89. After the etch back process, a thickness T3 of the insulating layer 89 may be in a range from 5 μm to 15 μm. In an embodiment, the thickness T3 of the insulating layer 89 may be greater than 10 μm. In an embodiment, adjacent conductive features 53 may be spaced apart from each other such that a first pitch P1 (also referred to as a distance between centerlines of the adjacent conductive features 53) is in a range from 3 μm to 25 μm. In an embodiment, adjacent conductive features 55 may be spaced apart from each other such that a second pitch P2 (also referred to as a distance between centerlines of the adjacent conductive features 55) is in a range from 5 μm to 30 μm. In an embodiment, adjacent conductive features 59 may be spaced apart from each other such that a third pitch P3 (also referred to as a distance between centerlines of the adjacent conductive features 59) is in a range from 3 μm to 30 μm. Although the second redistribution portion 93B is shown comprising three insulating layers 89, 81, and 57 as well as comprising the conductive features 55, and conductive vias 67 and 73, the second redistribution portion 93B may comprise any number of insulating layers having any number of conductive features and conductive vias.

Figure 13:
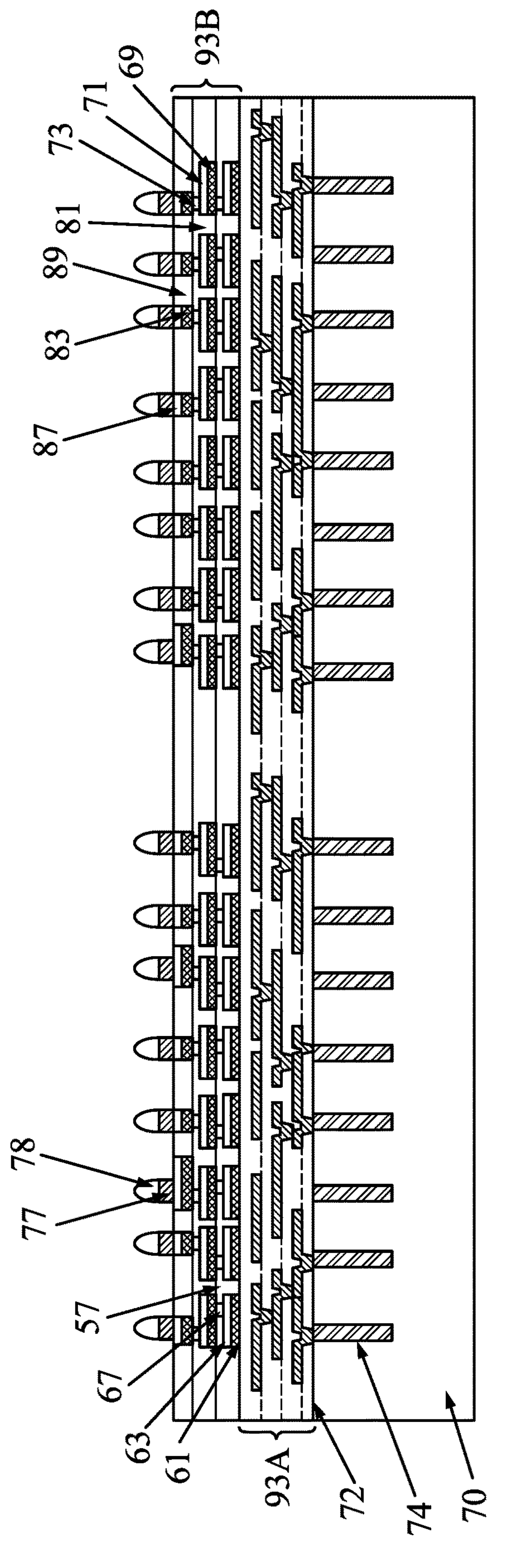

In FIG. 13, electrical connectors 77/78 are formed at the top surface of the redistribution structure 93 on the exposed conductive features 53. In some embodiments, under bump metallurgies (UBMs) may be formed over the conductive features 53. In another embodiment, the pads (UBMs) can extend across the top surface of the redistribution structure 93. In some embodiments, the electrical connectors 77/78 include a metal pillar 77 with a metal cap layer 78, which may be a solder cap, over the metal pillar 77. The electrical connectors 77/78 including the pillar 77 and the cap layer 78 are sometimes referred to as micro bumps 77/78. In some embodiments, the metal pillars 77 include a conductive material such as copper, aluminum, gold, nickel, palladium, the like, or a combination thereof and may be formed by sputtering, printing, electro plating, electroless plating, CVD, or the like. The metal pillars 77 may be solder free and have substantially vertical sidewalls. In some embodiments, a metal cap layer 78 is formed on the top of the metal pillar 77. The metal cap layer 78 may include nickel, tin, tin-lead, gold, copper, silver, palladium, indium, nickel-palladium-gold, nickel-gold, the like, or a combination thereof and may be formed by a plating process.

In another embodiment, the electrical connectors 77/78 do not include the metal pillars and are solder balls and/or bumps, such as controlled collapse chip connection (C4), electroless nickel immersion Gold (ENIG), electroless nickel electroless palladium immersion gold technique (ENEPIG) formed bumps, or the like. In this embodiment, the bump electrical connectors 77/78 may include a conductive material such as solder, copper, aluminum, gold, nickel, silver, palladium, tin, the like, or a combination thereof. In this embodiment, the electrical connectors 77/78 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

Figure 14:
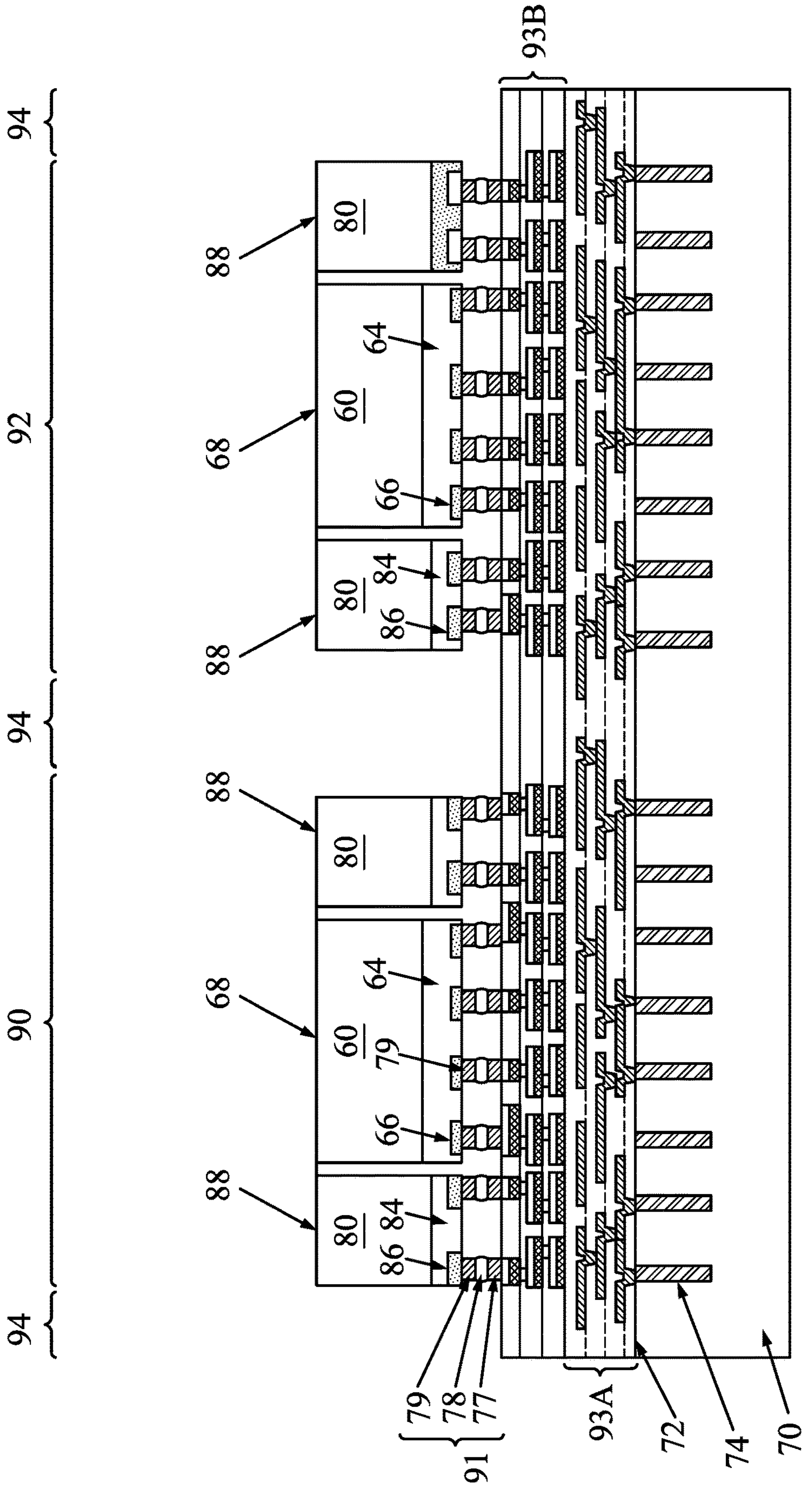

In FIG. 14, the dies 68 and the dies 88 are attached to the first side of the components 96, for example, through flip-chip bonding by way of the electrical connectors 77/78 and the metal pillars 79 on the dies to form conductive joints 91. The metal pillars 79 may be similar to the metal pillars 77 and the description is not repeated herein. The dies 68 and the dies 88 may be placed on the electrical connectors 77/78 using, for example, a pick-and-place tool. In some embodiments, the metal cap layers 78 are formed on the metal pillars 77 (as shown in FIG. 13), the metal pillars 79 of the dies 68 and the dies 88, or both.

The dies 88 may be formed through similar processing as described above in reference to the dies 68. In some embodiments, the dies 88 include one or more memory dies, such as a stack of memory dies (e.g., DRAM dies, SRAM dies, High-Bandwidth Memory (HBM) dies, Hybrid Memory Cubes (HMC) dies, or the like). In the stack of memory dies embodiments, a die 88 can include both memory dies and a memory controller, such as, for example, a stack of four or eight memory dies with a memory controller. Also, in some embodiments, the dies 88 may be different sizes (e.g., different heights and/or surface areas), and in other embodiments, the dies 88 may be the same size (e.g., same heights and/or surface areas).

In some embodiments, the dies 88 may be similar heights to those of the dies 68 (as shown in FIG. 14) or in some embodiments, the dies 68 and 88 may be of different heights.

The dies 88 include a main body 80, an interconnect structure 84, and die connectors 86. The main body 80 of the dies 88 may comprise any number of dies, substrates, transistors, active devices, passive devices, or the like. In an embodiment, the main body 80 may include a bulk semiconductor substrate, semiconductor-on-insulator (SOI) substrate, multi-layered semiconductor substrate, or the like. The semiconductor material of the main body 80 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The main body 80 may be doped or undoped. Devices, such as transistors, capacitors, resistors, diodes, and the like, may be formed in and/or on an active surface.

An interconnect structure 84 comprising one or more dielectric layer(s) and respective metallization pattern(s) is formed on the active surface. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, die connectors 86, such as conductive pillars (for example, comprising a metal such as copper), are formed in and/or on the interconnect structure 84 to provide an external electrical connection to the circuitry and devices. In some embodiments, the die connectors 86 protrude from the interconnect structure 84 to form pillar structure to be utilized when bonding the dies 88 to other structures. One of ordinary skill in the art will appreciate that the above examples are provided for illustrative purposes. Other circuitry may be used as appropriate for a given application.

More particularly, an IMD layer may be formed in the interconnect structure 84. The IMD layer may be formed, for example, of a low-K dielectric material, such as PSG, BPSG, FSG, $SiO_xC_y$, Spin-On-Glass, Spin-On-Polymers, silicon carbon material, compounds thereof, composites thereof, combinations thereof, or the like, by any suitable method known in the art, such as spinning, CVD, PECVD, HDP-CVD, or the like. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. The recesses and/or openings may be lined with a diffusion barrier layer and filled with a conductive material. The diffusion barrier layer may comprise one or more layers of tantalum nitride, tantalum, titanium nitride, titanium, cobalt tungsten, the like, or a combination thereof, deposited by ALD, or the like. The conductive material of the metallization patterns may comprise copper, aluminum, tungsten, silver, and combinations thereof, or the like, deposited by CVD, PVD, or the like. Any excessive diffusion barrier layer and/or conductive material on the IMD layer may be removed, such as by using a CMP.

In the embodiments wherein the die connectors 66 and 86 protrude from the interconnect structures 64 and 84, respectively, the metal pillars 79 may be excluded from the dies 68 and 86 as the protruding die connectors 66 and 86 may be used as the pillars for the metal cap layers 78.

The conductive joints 91 electrically couple the circuits in the dies 68 and the dies 88 through interconnect structures 84 and 64 and die connectors 86 and 66, respectively, to redistribution structure 93 and TVs 74 in components 96.

In some embodiments, before bonding the electrical connectors 77/78, the electrical connectors 77/78 are coated with a flux (not shown), such as a no-clean flux. The electrical connectors 77/78 may be dipped in the flux or the flux may be jetted onto the electrical connectors 77/78. In another embodiment, the flux may also be applied to the electrical connectors 79/78. In some embodiments, the electrical connectors 77/78 and/or 79/78 may have an epoxy flux (not shown) formed thereon before they are reflowed with at least some of the epoxy portion of the epoxy flux remaining after the dies 68 and the dies 88 are attached to the components 96. This remaining epoxy portion may act as an underfill to reduce stress and protect the joints resulting from the reflowing the electrical connectors 77/78/79.

The bonding between the dies 68 and 88 and the components 96 may be a solder bonding or a direct metal-to-metal (such as a copper-to-copper or tin-to-tin) bonding. In an embodiment, the dies 68 and the dies 88 are bonded to the components 96 by a reflow process. During this reflow process, the electrical connectors 77/78/79 are in contact with the die connectors 66 and 86, respectively, and the conductive features 53 of the redistribution structure 93 to physically and electrically couple the dies 68 and the dies 88 to the components 96. After the bonding process, an intermetallic compound (IMC) (not shown) may form at the interface of the metal pillars 77 and 79 and the metal cap layers 78.

In FIG. 14 and subsequent figures, a first package region 90 and a second package region 92 for the formation of a first package and a second package, respectively, are illustrated. Scribe line regions 94 are between adjacent package regions. As illustrated in FIG. 14, a first die and multiple second dies are attached in each of the first package region 90 and the second package region 92.

In some embodiments, the dies 68 are system-on-a-chip (SoC) or a graphics processing unit (GPU) and the second dies are memory dies that may utilized by the dies 68. In an embodiment, the dies 88 are stacked memory dies. For example, the stacked memory dies 88 may include low-power (LP) double data rate (DDR) memory modules, such as LPDDR1, LPDDR2, LPDDR3, LPDDR4, or the like memory modules.

Figure 15:
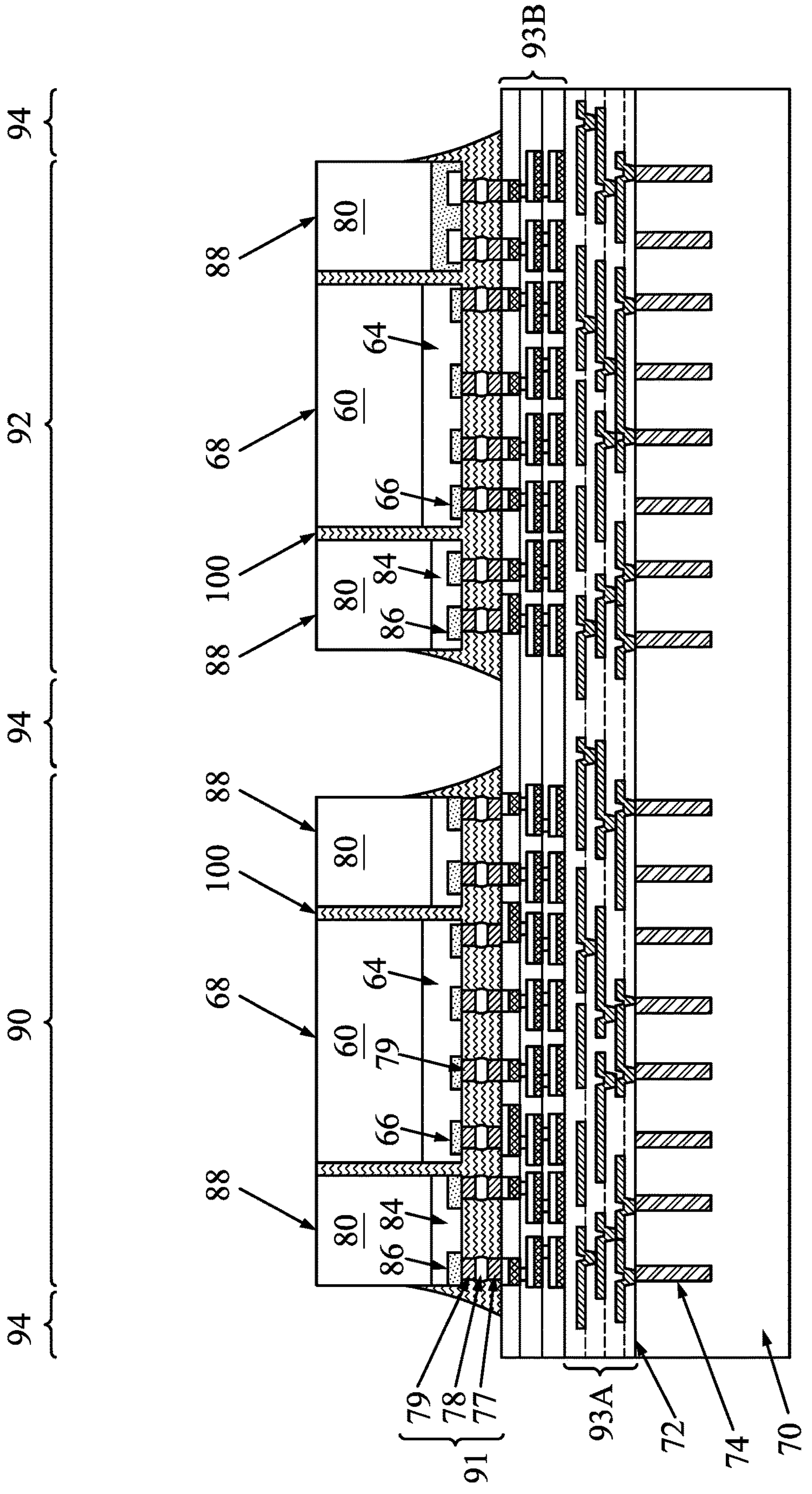

In FIG. 15, an underfill material 100 is dispensed into the gaps between the dies 68, the dies 88, and the redistribution structure 93. The underfill material 100 may extend up along sidewall of the dies 68 and the dies 88. The underfill material 100 may be any acceptable material, such as a polymer, epoxy, molding underfill, or the like. The underfill material 100 may be formed by a capillary flow process after the dies 68 and 88 are attached, or may be formed by a suitable deposition method before the dies 68 and 88 are attached.

Figure 16:
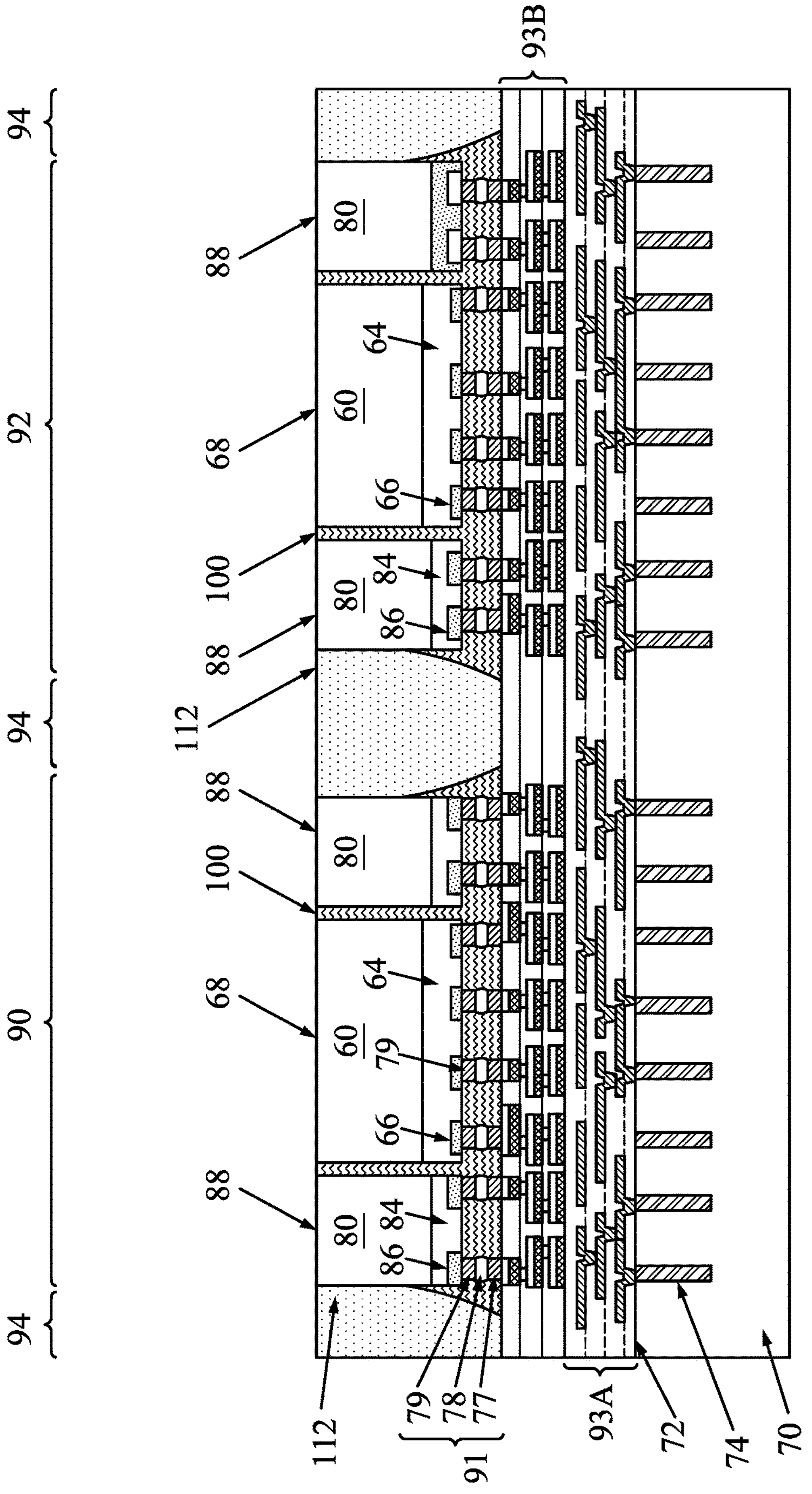

In FIG. 16, an encapsulant 112 is formed on the various components. The encapsulant 112 may be a molding compound, epoxy, or the like, and may be applied by compression molding, transfer molding, or the like. A curing step is performed to cure the encapsulant 112, such as a thermal curing, an Ultra-Violet (UV) curing, or the like. In some embodiments, the dies 68 and the dies 88 are buried in the encapsulant 112, and after the curing of the encapsulant 112, a planarization step, such as a grinding, may be performed to remove excess portions of the encapsulant 112, which excess portions are over top surfaces of the dies 68 and the dies 88. Accordingly, top surfaces of dies 68 and the dies 88 are exposed, and are level with a top surface of the encapsulant 112. In some embodiments, the dies 88 may be different heights from the dies 68 and the dies 88 will still be covered by the encapsulant 112 after the planarization step.

Figure 17:
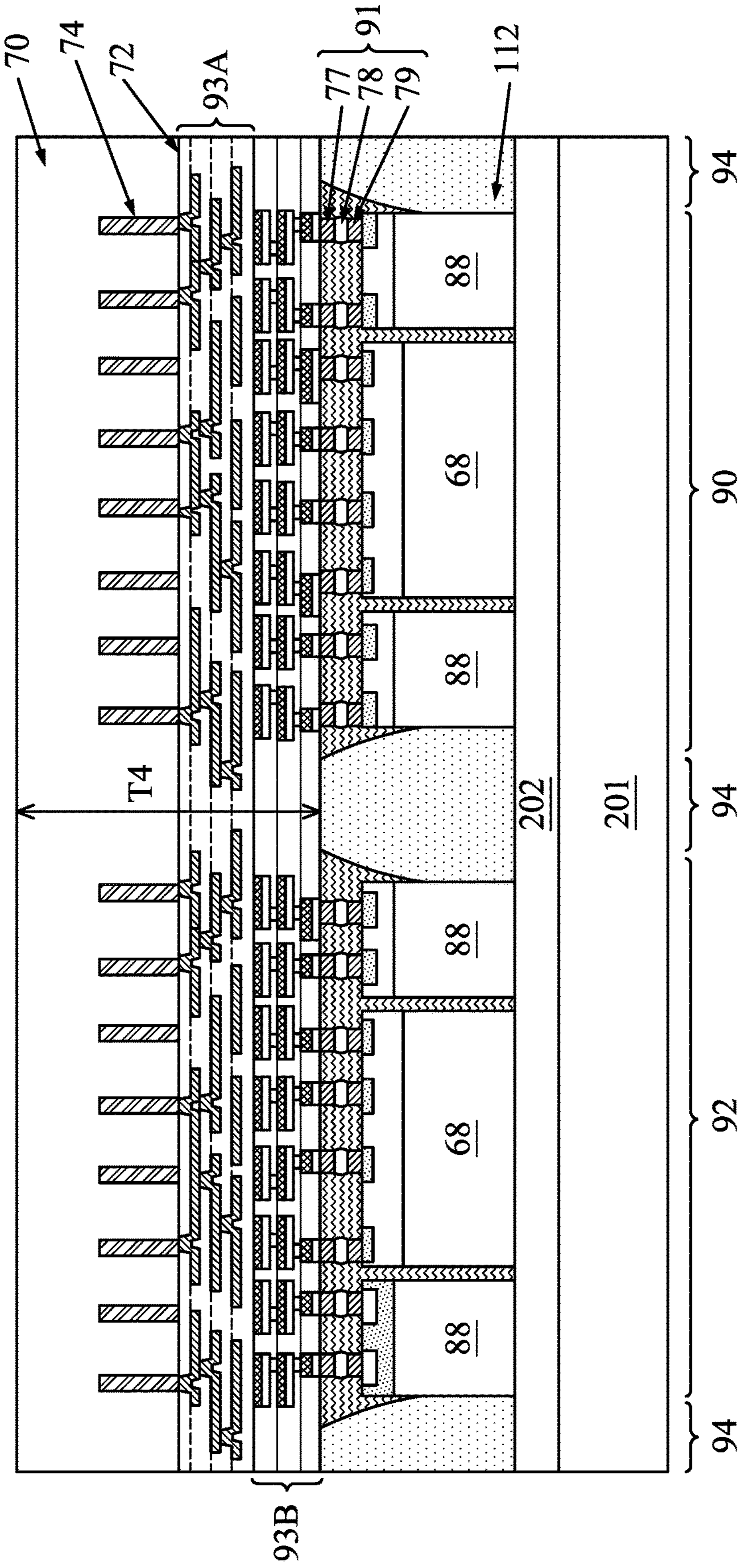

In FIG. 17, the structure of FIG. 16 is flipped over and the structure may be placed on carrier substrate 201 or other suitable support structure. The carrier substrate 201 may be a glass carrier substrate, a ceramic carrier substrate, or the like. The structure of FIG. 16 may be attached to the carrier substrate 201 by a release layer 202. The release layer 202 may be formed of a polymer-based material, which may be removed along with the carrier substrate 201 from the overlying structures. In some embodiments, the release layer 202 is an epoxy-based thermal-release material, which loses its adhesive property when heated, such as a light-to-heat-conversion (LTHC) release coating. In other embodiments, the release layer 202 may be an ultra-violet (UV) glue, which loses its adhesive property when exposed to UV lights. The release layer 202 may be dispensed as a liquid and cured, may be a laminate film laminated onto the carrier substrate 201, or may be the like. As shown in FIG. 17, at this stage of processing, the substrate 70 and redistribution structure 93 of the components 96 have a combined thickness T4 in a range from about 50 μm to about 775 μm.

Figure 18:
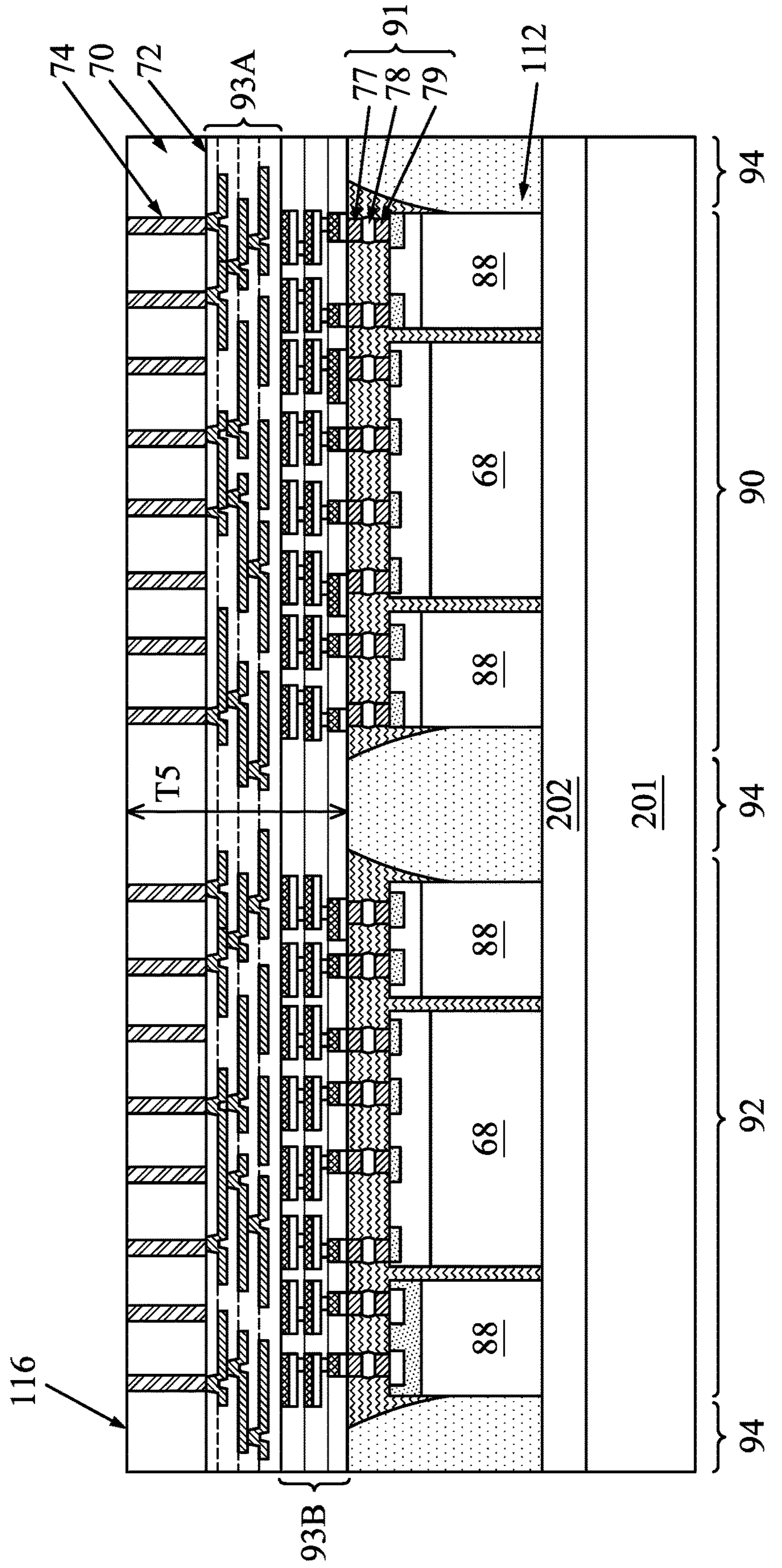

In FIG. 18, a thinning process is performed on the second side of the substrate 70 to thin the substrate 70 to a second surface 116 until TVs 74 are exposed. The thinning process may include an etching process, a grinding process, the like, or a combination thereof. In some embodiments, after the thinning process, the substrate 70 and redistribution structure 93 of the components 96 have a combined thickness T5 in a range from about 30 μm to about 200 μm.

Figure 19:
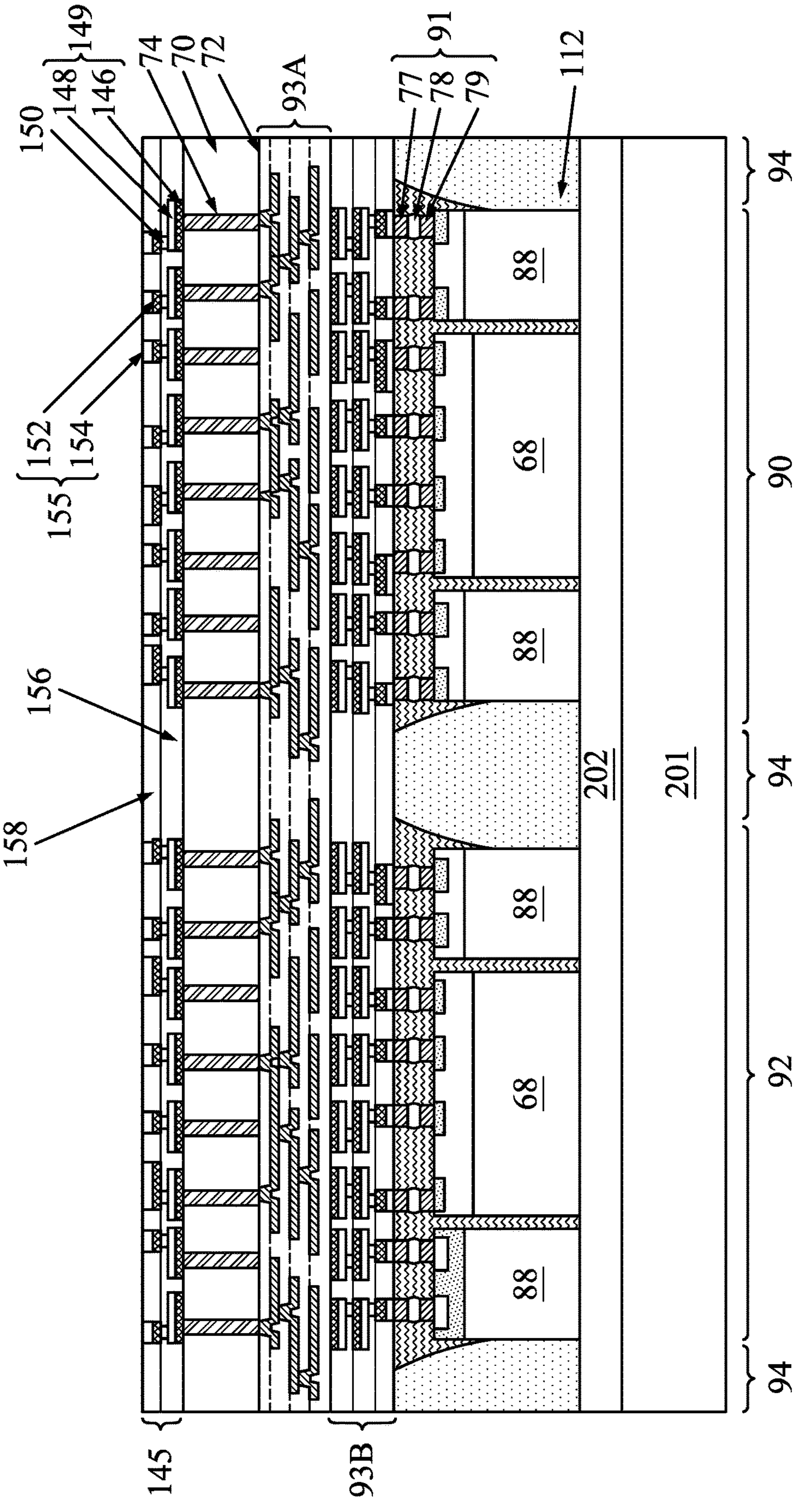

In FIG. 19, a redistribution structure 145 is formed on the second surface 116 of the substrate 70. The redistribution structure 145 may be formed in a similar manner and comprise similar materials as the second redistribution portion 93B described above in FIGS. 3 through 12. Although the redistribution structure 145 is shown comprising insulating layers 156 and 158 (similar to insulating layers 57, 81, and 89 in FIGS. 6, 9, and 12, respectively), conductive vias 150 (similar to conductive vias 67 and 73 in FIGS. 4 and 8, respectively), and conductive features 149 and 155 (similar to conductive features 59 and 53 in FIGS. 6 and 11 respectively), the redistribution structure 145 may comprise any number of insulating layers having any number of redistribution lines (similar to conductive features 55 described above in FIG. 9) and conductive vias to interconnect any devices and/or through-vias (TVs) 74 together and/or to an external device.

Figure 20:
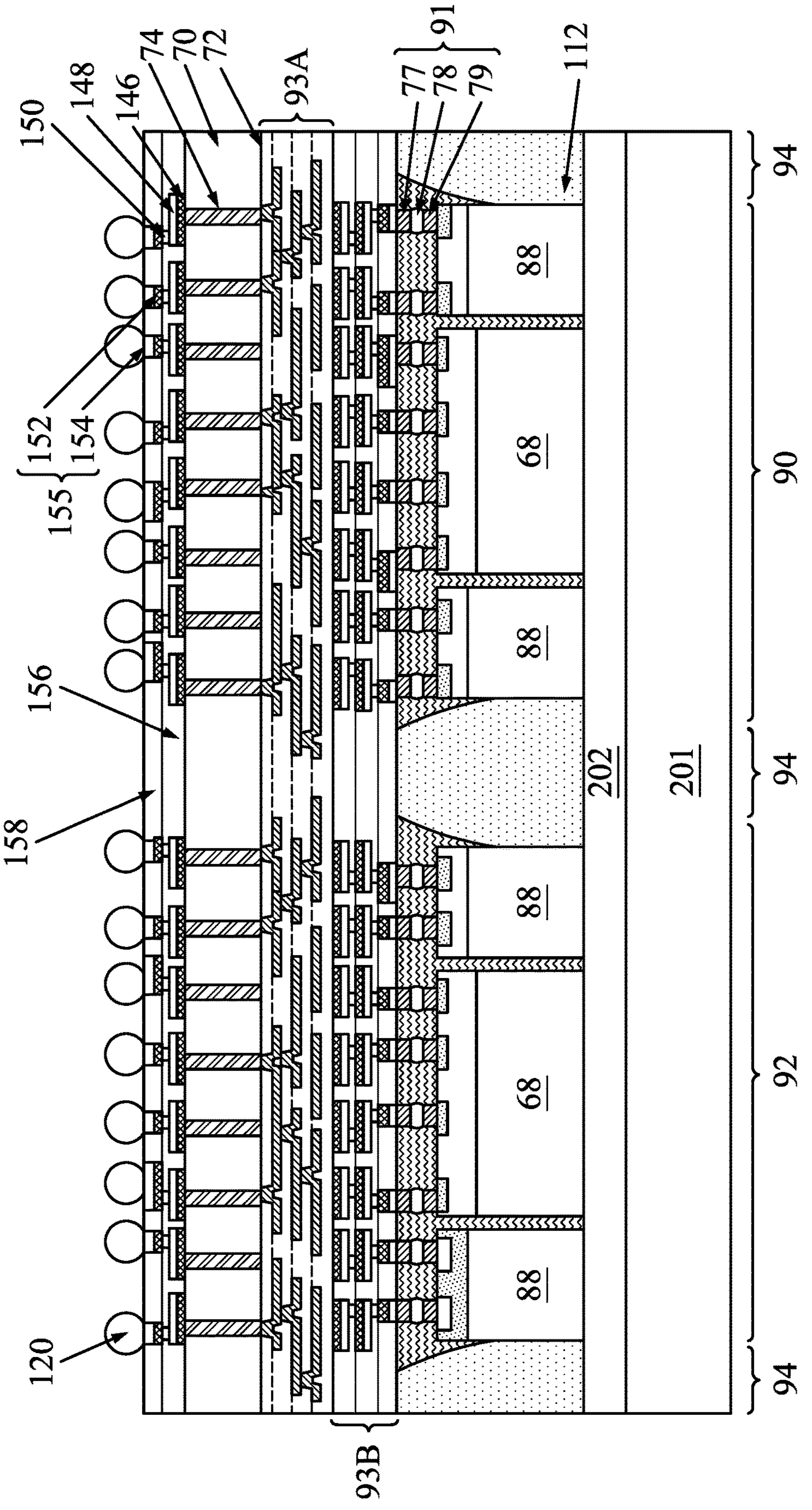

In FIG. 20, electrical connectors 120 are formed on the conductive features 155 at the top surface of the redistribution structure 145 such that they are electrically coupled to TVs 74. In some embodiments, UBMs may be formed to extend across the top surface of the redistribution structure, and the electrical connectors 120 are subsequently formed on the UBMs.

In some embodiments, the electrical connectors 120 are solder balls and/or bumps, such as ball grid array (BGA) balls, C4 micro bumps, ENIG formed bumps, ENEPIG formed bumps, or the like. The electrical connectors 120 may include a conductive material such as solder, copper, aluminum, gold, nickel, silver, palladium, tin, the like, or a combination thereof. In some embodiments, the electrical connectors 120 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the electrical connectors 120 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 120. The metal cap layer may include nickel, tin, tin-lead, gold, silver, palladium, indium, nickel-palladium-gold, nickel-gold, the like, or a combination thereof and may be formed by a plating process.

Figure 22:
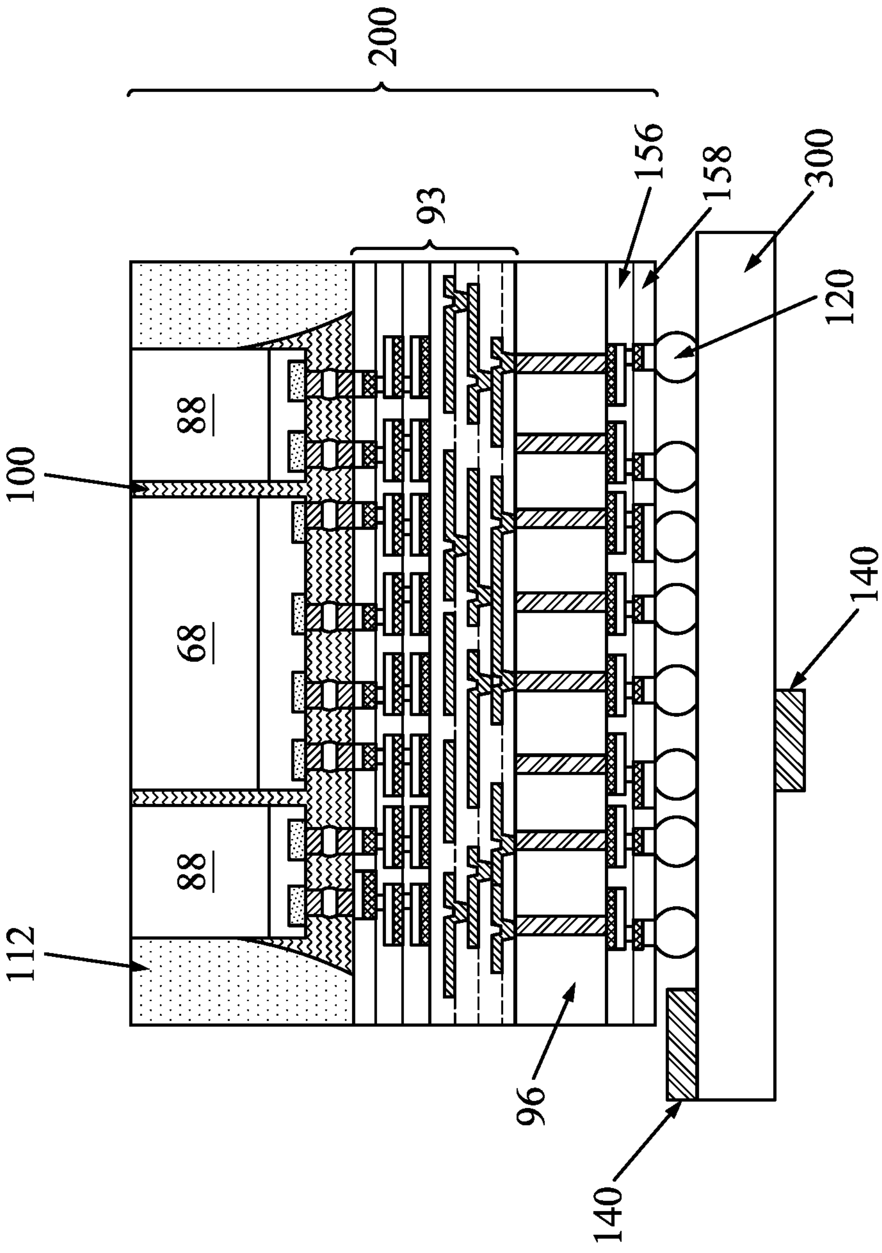

The electrical connectors 120 may be used to bond to an additional electrical component, which may be a semiconductor substrate, a package substrate, a Printed Circuit Board (PCB), or the like (see 300 in FIG. 22).

Figure 21:
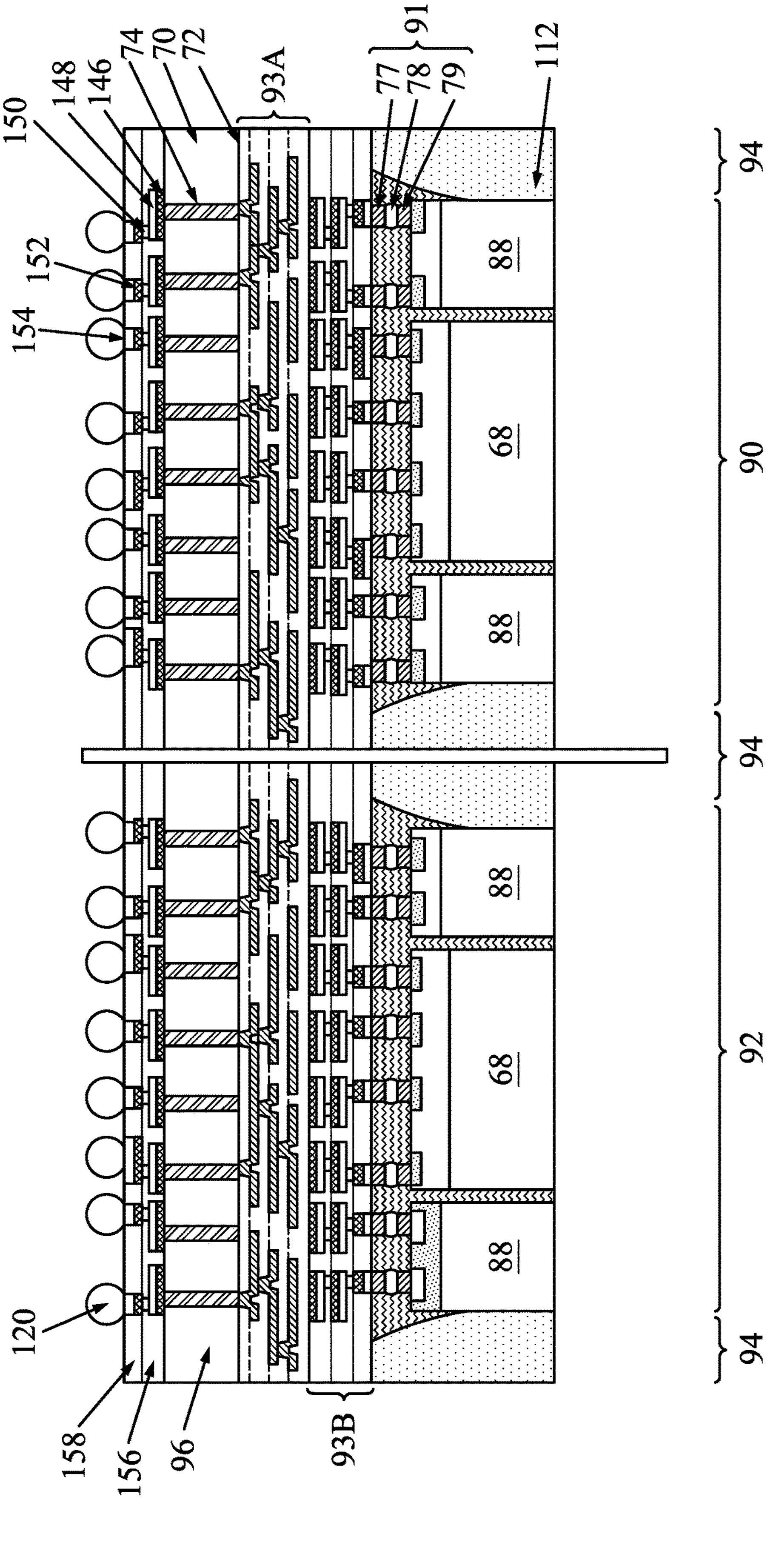

In FIG. 21, components 96 are singulated between adjacent regions 90 and 92 along scribe line regions 94 to form component packages 200 comprising, among other things, a die 68, a component 96, and the dies 88. The singulation may be by sawing, dicing, or the like. After the singulation process, remaining portions of the encapsulant 112 have sidewall surfaces that are coterminous with the lateral extents of the component package 200 (see, e.g., FIGS. 21 and 22).

FIG. 22 illustrates the attachment of a component package 200 on a substrate 300. Electrical connectors 120 are aligned to, and are put against, bond pads of the substrate 300. The electrical connectors 120 may be reflowed to create a bond between the substrate 300 and the component 96. The substrate 300 may comprise a package substrate, such as a build-up substrate including a core therein, a laminate substrate including a plurality of laminated dielectric films, a PCB, or the like. The substrate 300 may comprise electrical connectors (not shown), such as solder balls, opposite the component package to allow the substrate 300 to be mounted to another device. An underfill material (not shown) can be dispensed between the component package 200 and the substrate 300 and surrounding the electrical connectors 120. The underfill material may be any acceptable material, such as a polymer, epoxy, molding underfill, or the like.

Additionally, one or more surface devices 140 may be connected to the substrate 300. The surface devices 140 may be used to provide additional functionality or programming to the component package 200, or the package as a whole. In an embodiment, the surface devices 140 may include surface mount devices (SMDs) or integrated passive devices (IPDs) that include passive devices such as resistors, inductors, capacitors, jumpers, combinations of these, or the like that are desired to be connected to and utilized in conjunction with component package 200, or other parts of the package. The surface devices 140 may be placed on a first major surface of the substrate 300, an opposing major surface of the substrate 300, or both, according to various embodiments.

Figure 23A:
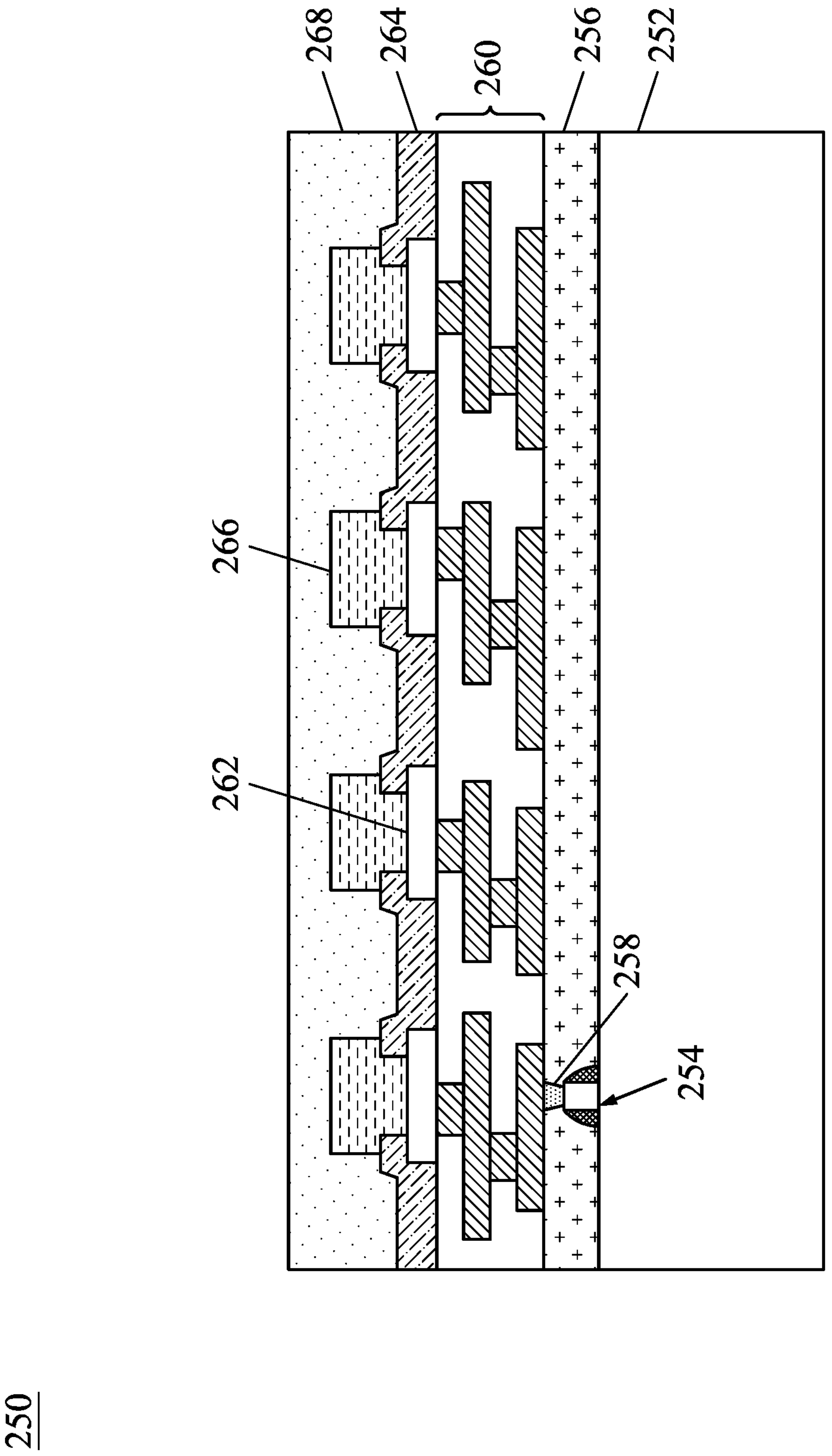
FIGS. 23A and 23B are cross-sectional views in an example process of forming a package structure in accordance with an alternate embodiment.
Figure 23B:
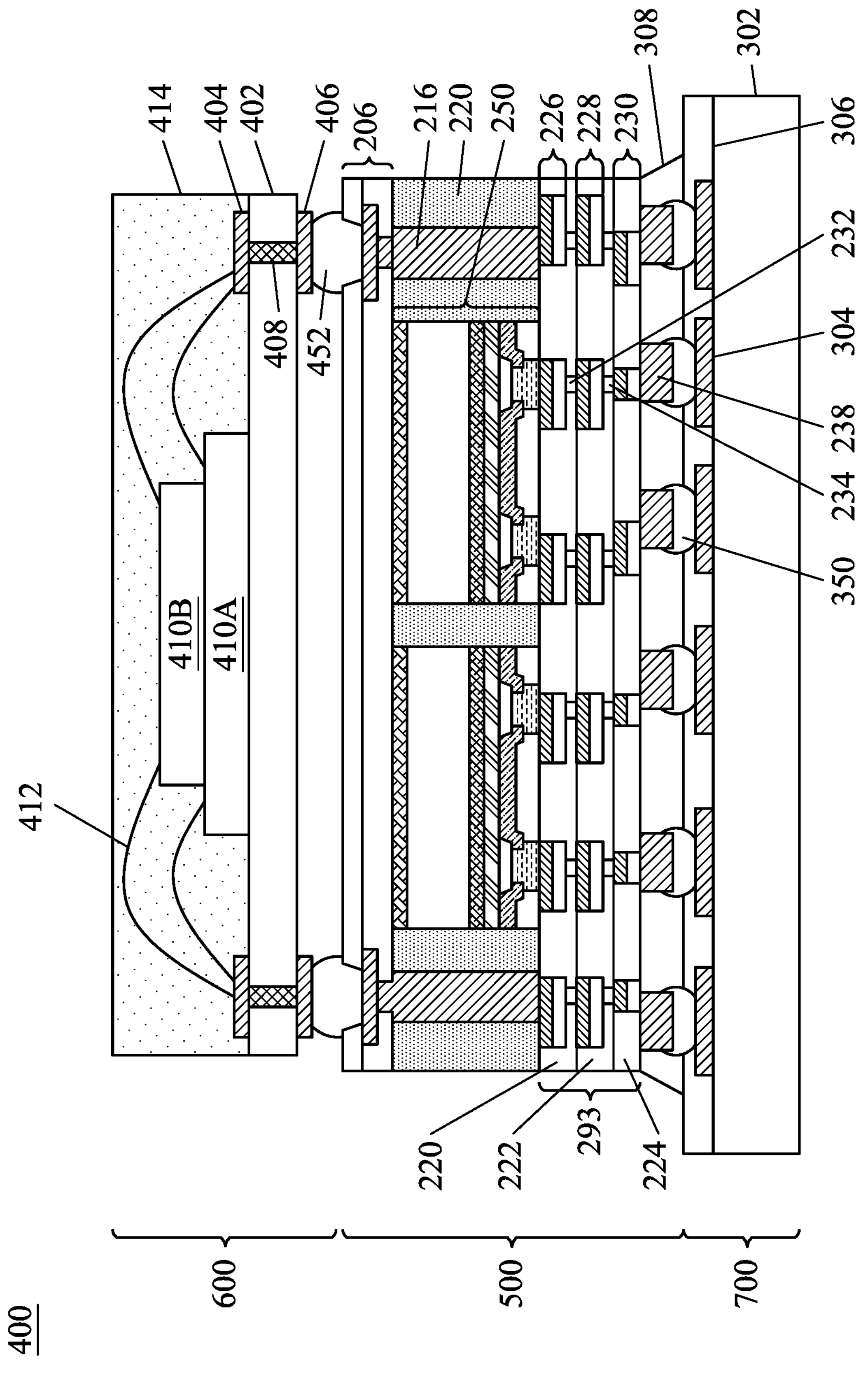

FIGS. 23A and 23B illustrate an alternative embodiment that shows a packaged semiconductor device 400. Unless specified otherwise, like reference numerals in this embodiment represent like components in the embodiment shown in FIGS. 1 through 22 formed by like processes. Accordingly, the process steps and applicable materials may not be repeated herein. The packaged semiconductor device 400 may also be referred to as an integrated fan-out (InFO) package. The packaged semiconductor device 400 may comprise a first package component 500 coupled to a second package component 600. The first package component 500 may comprise one or more integrated circuit dies 250 that are electrically connected to a package substrate 700 through a redistribution structure 293.

FIG. 23A illustrates a cross-sectional view of the integrated circuit die 250 in accordance with some embodiments. The integrated circuit die 250 may be formed in a wafer, which may include different device regions that are singulated in subsequent steps to form a plurality of integrated circuit dies. The integrated circuit die 250 may be processed according to applicable manufacturing processes to form integrated circuits. For example, the integrated circuit die 250 includes a semiconductor substrate 252, such as silicon, doped or undoped, or an active layer of a semiconductor-on-insulator (SOI) substrate. The semiconductor substrate 252 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 252 has an active surface (e.g., the surface facing upwards in FIG. 23A), sometimes called a front side and an inactive surface (e.g., the surface facing downwards in FIG. 23A), sometimes called a back side.

Devices (represented by a transistor) 254 may be formed at the front surface of the semiconductor substrate 252. The devices 254 may be active devices (e.g., transistors, diodes, etc.), capacitors, resistors, etc. An inter-layer dielectric (ILD) 256 is over the front surface of the semiconductor substrate 252. The ILD 256 surrounds and may cover the devices 254. The ILD 256 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 258 extend through the ILD 256 to electrically and physically couple the devices 254. For example, when the devices 254 are transistors, the conductive plugs 258 may couple the gates and source/drain regions of the transistors. The conductive plugs 258 may be formed of tungsten, cobalt, nickel, copper, silver, gold, aluminum, the like, or combinations thereof. An interconnect structure 260 is over the ILD 256 and conductive plugs 258. The interconnect structure 260 interconnects the devices 254 to form an integrated circuit. The interconnect structure 260 may be formed by, for example, metallization patterns in dielectric layers on the ILD 256. The metallization patterns include metal lines and vias formed in one or more low-k dielectric layers. The metallization patterns of the interconnect structure 260 are electrically coupled to the devices 254 by the conductive plugs 258.

The integrated circuit die 250 further includes pads 262, such as aluminum pads, to which external connections are made. The pads 262 are on the active side of the integrated circuit die 250, such as in and/or on the interconnect structure 260. One or more passivation films 264 are on the integrated circuit die 250, such as on portions of the interconnect structure 260 and pads 262. Openings extend through the passivation films 264 to the pads 262. Die connectors 266, such as conductive pillars (for example, formed of a metal such as copper), extend through the openings in the passivation films 264 and are physically and electrically coupled to respective ones of the pads 262. The die connectors 266 may be formed by, for example, plating, or the like. The die connectors 266 electrically couple the respective integrated circuits of the integrated circuit die 250.

FIG. 23B shows the first package component 500 comprising one or more integrated circuit dies 250 and through vias 216 encapsulated by an encapsulant 220. The through vias 216 may comprise a conductive material such as copper, titanium, tungsten, aluminum, or the like. The encapsulant 220 may be a molding compound, epoxy, or the like. The encapsulant 220 may be applied by compression molding, transfer molding, or the like. A redistribution structure 293 is formed over the encapsulant 220, through vias 216, and integrated circuit dies 250 in order to interconnect integrated circuit dies 250 and the through vias 216 to an external device such as the package substrate 700. The redistribution structure 293 may be formed in a similar manner and comprise similar materials as the second redistribution portion 93B described above in FIGS. 3 through 12. Although the redistribution structure 293 is shown comprising insulating layers 220, 222, and 224 (similar to insulating layers 57, 81, and 89 in FIGS. 6, 9, and 12, respectively), conductive vias 232 and 234 (similar to conductive vias 67 and 73 in FIGS. 4 and 8, respectively), conductive features 230 and 226 (similar to conductive features 59 and 53 in FIGS. 6 and 11 respectively), and conductive features 228 (similar to conductive features 55 in FIG. 9), the redistribution structure 293 may comprise any number of insulating layers having any number of redistribution lines and conductive vias to interconnect integrated circuit dies 250 and the through vias 216 to an external device. The die connectors 266 of the integrated circuit dies 250 and the through vias 216 are physically and electrically coupled to respective ones of the conductive features 226 of the redistribution structure 293.

Advantages can be achieved as a result of the formation of the redistribution structure 293 by methods and using materials that are similar to those during the formation of the second redistribution portion 93B described previously in FIGS. 3 through 12. These advantages include allowing the conductive vias 232 and 234 to have a smaller width and a larger height (e.g., having a higher aspect ratios), and allowing the conductive features 226 and 230 to be formed with a smaller widths, all of which allow for a higher routing density that is suitable for high-speed transmission, high capacity bandwidth, and high speed computing applications. In addition, the insulating layers 220 and 222 can be formed to a greater thickness, which increases device reliability and helps to prevent resistive-capacitive (RC) delay during operation.

In FIG. 23B, UBMs 238 are formed on the conductive features 226 for external connection to the redistribution structure 293. As a result, the UBMs 138 are electrically coupled to the through vias 216 and the integrated circuit dies 250. The UBMs 238 may be formed of a seed layer comprising a titanium layer and a copper layer over the titanium layer. The seed layer may be formed using, for example, PVD or the like. A conductive material is then formed on the seed layer. The conductive material may be formed by plating, such as electroplating or electroless plating, or the like. The conductive material may comprise a metal, like copper, titanium, tungsten, aluminum, or the like.

Conductive connectors 350 are then formed on the UBMs 238. The conductive connectors 350 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 350 may include a conductive material such as solder, copper, aluminum, gold, nickel, silver, palladium, tin, the like, or a combination thereof. In some embodiments, the conductive connectors 350 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 350 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

The first package component 500 may then be mounted to the package substrate 700 using the conductive connectors 350. The package substrate 700 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be an SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302.

The substrate core 302 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 350 are reflowed to attach the first package component 500 to the bond pads 304. The conductive connectors 350 electrically and/or physically couple the package substrate 700, including metallization layers in the substrate core 302, to the first package component 500. In some embodiments, a solder resist 306 is formed on the substrate core 302. The conductive connectors 350 may be disposed in openings in the solder resist 306 to be electrically and mechanically coupled to the bond pads 304. The solder resist 306 may be used to protect areas of the substrate core 302 from external damage.

The conductive connectors 350 may have an epoxy flux (not shown) formed thereon before they are reflowed with at least some of the epoxy portion of the epoxy flux remaining after the first package component 500 is attached to the package substrate 700. This remaining epoxy portion may act as an underfill to reduce stress and protect the joints resulting from reflowing the conductive connectors 350. In some embodiments, an underfill 308 may be formed between the first package component 500 and the package substrate 700 and surrounding the conductive connectors 350. The underfill 308 may be formed by a capillary flow process after the first package component 500 is attached or may be formed by a suitable deposition method before the first package component 500 is attached.

In an embodiment, the second package component 600 is electrically and physically coupled to the first package component 500. The second package component 600 includes, for example, a substrate 402 and one or more stacked dies 410 (e.g., 410A and 410B) coupled to the substrate 402. Although one set of stacked dies 410 (410A and 410B) is illustrated, in other embodiments, a plurality of stacked dies 410 (each having one or more stacked dies) may be disposed side-by-side coupled to a same surface of the substrate 402. The substrate 402 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 402 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 402 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 402.

The substrate 402 may include active and passive devices (not shown). A wide variety of devices such as transistors, capacitors, resistors, combinations of these, and the like may be used to generate the structural and functional requirements of the design for the second package component 600. The devices may be formed using any suitable methods.

The substrate 402 may also include metallization layers (not shown) and the conductive vias 408. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 402 is substantially free of active and passive devices.

The substrate 402 may have bond pads 404 on a first side of the substrate 402 to couple to the stacked dies 410, and bond pads 406 on a second side of the substrate 402, the second side being opposite the first side of the substrate 402, to couple to conductive connectors 452. In some embodiments, the bond pads 404 and 406 are formed by forming recesses (not shown) into dielectric layers (not shown) on the first and second sides of the substrate 402. The recesses may be formed to allow the bond pads 404 and 406 to be embedded into the dielectric layers. In other embodiments, the recesses are omitted as the bond pads 404 and 406 may be formed on the dielectric layer. In some embodiments, the bond pads 404 and 406 include a thin seed layer (not shown) made of copper, titanium, nickel, gold, palladium, the like, or a combination thereof. The conductive material of the bond pads 404 and 406 may be deposited over the thin seed layer. The conductive material may be formed by an electrochemical plating process, an electroless plating process, CVD, atomic layer deposition (ALD), PVD, the like, or a combination thereof. In an embodiment, the conductive material of the bond pads 404 and 406 is copper, tungsten, aluminum, silver, gold, the like, or a combination thereof.

In some embodiments, the bond pads 404 and the bond pads 406 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 404 and 406. Any suitable materials or layers of material that may be used for the bond pads 404 and 406 are fully intended to be included within the scope of the current application. In some embodiments, conductive vias 408 extend through the substrate 402 and couple at least one of the bond pads 404 to at least one of the bond pads 406.

In the illustrated embodiment, the stacked dies 410 are coupled to the substrate 402 by wire bonds 412, although other connections may be used, such as conductive bumps. In an embodiment, the stacked dies 410 are stacked memory dies. For example, the stacked dies 410 may be memory dies such as low-power (LP) double data rate (DDR) memory modules, such as LPDDR1, LPDDR2, LPDDR3, LPDDR4, or the like memory modules.

The stacked dies 410 and the wire bonds 412 may be encapsulated by a molding material 414. The molding material 414 may be molded on the stacked dies 410 and the wire bonds 412, for example, using compression molding. In some embodiments, the molding material 414 is a molding compound, a polymer, an epoxy, silicon oxide filler material, the like, or a combination thereof. A curing process may be performed to cure the molding material 414; the curing process may be a thermal curing, a UV curing, the like, or a combination thereof.

The second package component 600 is mechanically and electrically bonded to the first package component 500 by way of the conductive connectors 452, the bond pads 406, and a metallization pattern of a back-side redistribution structure 206 on the first package component 500. In some embodiments, the stacked dies 410 may be coupled to the integrated circuit dies 250 through the wire bonds 412, the bond pads 404 and 406, the conductive vias 408, the conductive connectors 452, the back-side redistribution structure 206, the through vias 216, and the redistribution structure 293.

In some embodiments, a solder resist (not shown) is formed on the side of the substrate 402 opposing the stacked dies 410. The conductive connectors 452 may be disposed in openings in the solder resist to be electrically and mechanically coupled to conductive features (e.g., the bond pads 406) in the substrate 402. The solder resist may be used to protect areas of the substrate 202 from external damage.

In some embodiments, the conductive connectors 452 have an epoxy flux (not shown) formed thereon before they are reflowed with at least some of the epoxy portion of the epoxy flux remaining after the second package component 600 is attached to the first package component 500.

In some embodiments, an underfill (not shown) is formed between the first package component 500 and the second package component 600, surrounding the conductive connectors 452. The underfill may reduce stress and protect the joints resulting from the reflowing of the conductive connectors 452. The underfill may be formed by a capillary flow process after the second package component 600 is attached, or may be formed by a suitable deposition method before the second package component 600 is attached. In embodiments where the epoxy flux is formed, it may act as the underfill.

The embodiments of the present disclosure have some advantageous features. The embodiments include the formation of a device package (e.g., a chip-on-wafer-on-substrate (CoWoS) package) comprising one or more semiconductor chips bonded to an interposer and a package substrate bonded to a side of the interposer opposing the one or more semiconductor chips. The interposer may include a redistribution structure (e.g., comprising redistribution lines and/or conductive vias disposed in one or more insulating layers) disposed on a semiconductor substrate. The redistribution structure may be formed by the methods that include forming a patterned photoresist over a first conductive feature and forming a conductive via in the patterned photoresist over the first conductive feature. The photoresist is removed and a polyimide layer is coated over the conductive via and the first conductive feature. The polyimide layer is etched to expose a top surface of the conductive via and a second conductive feature is then formed over the conductive via and the etched polyimide layer. One or more embodiments disclosed herein may include allowing the conductive via to have a smaller width and a larger height (e.g., having a higher aspect ratio), which allows for a higher routing density that is suitable for high-speed transmission, high capacity bandwidth, and high speed computing applications. In addition, the polyimide layer can be formed to a greater thickness, which increases the reliability of the device package and helps to prevent resistive-capacitive (RC) delay during operation.

In accordance with an embodiment, a method includes forming a redistribution structure, where forming the redistribution structure includes forming a first conductive material on a portion of a first seed layer; forming a mask over the first seed layer and the first conductive material, where an opening in the mask at least partially exposes the first conductive material; forming a first conductive via in the opening; etching portions of the first seed layer using the first conductive material as an etching mask; depositing a first insulating layer over the first conductive via, the first conductive material and remaining portions of the first seed layer; and etching the first insulating layer such that a portion of the first conductive via protrudes above a top surface of the first insulating layer; and attaching a first die to the redistribution structure using first electrical connectors. In an embodiment, the method further includes depositing a second seed layer on the first insulating layer and the first conductive via; and plating a second conductive material on a portion of the second seed layer. In an embodiment, the second seed layer is in physical contact with a top surface and sidewalls of a first portion of the first conductive via, the second seed layer being separate from sidewalls of a second portion of the first conductive via, and the first portion of the first conductive via being above the second portion of the first conductive via. In an embodiment, etching the first insulating layer includes a plasma etching process that includes a combination of plasmas derived from $CF_4$ and $O_2$ gases. In an embodiment, the first insulating layer includes a polyimide. In an embodiment, after etching the first insulating layer, the first insulating layer has a thickness greater than 10 μm. In an embodiment, the first conductive via has a trapezoid shape, where a width of the first conductive via decreases in a direction from the first conductive material towards the first die, and a bottom corner of the first conductive via has an inner angle that is smaller than 90°.

In accordance with an embodiment, a method includes forming a first redistribution structure over a substrate, where forming the first redistribution structure includes depositing a first seed layer over a first conductive via and a first insulating layer; forming a first conductive material on the first seed layer; forming a mask over the first seed layer and the first conductive material; forming an opening in the mask that exposes the first conductive material; forming a second conductive via in the opening; depositing a second insulating layer around the second conductive via and the first conductive material; and forming a conductive feature over and electrically connected to the second conductive via, where the first insulating layer and the second insulating layer each have a respective thickness that is greater than 10 μm. In an embodiment, the conductive feature has a width that is in a range from 1.2 μm to 12 μm. In an embodiment, the second conductive via has a trapezoid shape, where a topmost surface of the second conductive via has a smaller width than a bottommost surface of the second conductive via, and where the topmost surface of the second conductive via is farther away from the substrate than the bottommost surface of the second conductive via. In an embodiment, the first insulating layer and the second insulating layer include a polyimide. In an embodiment, the method further includes etching the second insulating layer to expose a top surface of the second conductive via, where after etching the second insulating layer a portion of the second conductive via protrudes above a top surface of the second insulating layer. In an embodiment, a portion of the first conductive via protrudes above a top surface of the first insulating layer. In an embodiment, widths of the first conductive via and the second conductive via are smaller than 1 μm.

In accordance with an embodiment, a package comprises a redistribution structure including a first conductive feature; a first insulating layer surrounding the first conductive feature, where the first insulating layer is in physical contact with a top surface and sidewalls of the first conductive feature; a first conductive via over the first conductive feature and surrounded by the first insulating layer; a first seed layer on a top surface of the first conductive via; and a second conductive feature on the first seed layer, where the first conductive via has a trapezoid shape, and where a width of the first conductive via decreases in a direction from the first conductive feature towards the second conductive feature; and a first die over and bonded to the redistribution structure by first connectors. In an embodiment, an angle between a surface of the first insulating layer that is in contact with a sidewall of the first conductive via and a surface of the first insulating layer that is in contact with a top surface of the first conductive feature is greater than 90°. In an embodiment, the first insulating layer has a thickness greater than 10 μm. In an embodiment, the first insulating layer includes a polyimide. In an embodiment, a width of the first conductive via is smaller than 1 μm. In an embodiment, the first seed layer is in physical contact with a sidewall of a first portion of the first conductive via, and where the first seed layer does not physically contact a sidewall of a second portion of the first conductive via, where the first portion of the first conductive via is higher than the second portion of the first conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a redistribution structure, wherein forming the redistribution structure comprises:

forming a first conductive material on a portion of a first seed layer;

forming a mask over the first seed layer and the first conductive material, wherein an opening in the mask at least partially exposes the first conductive material;

forming a first conductive via in the opening;

etching portions of the first seed layer using the first conductive material as an etching mask;

depositing a first insulating layer over the first conductive via, the first conductive material and remaining portions of the first seed layer; and etching the first insulating layer such that a portion of the first conductive via protrudes above a top surface of the first insulating layer; and attaching a first die to the redistribution structure using first electrical connectors.

2. The method of claim 1 further comprising:

depositing a second seed layer on the first insulating layer and the first conductive via; and plating a second conductive material on a portion of the second seed layer.

3. The method of claim 2, wherein the second seed layer is in physical contact with a top surface and sidewalls of a first portion of the first conductive via, the second seed layer being separate from sidewalls of a second portion of the first conductive via, and the first portion of the first conductive via being above the second portion of the first conductive via.

4. The method of claim 1, wherein etching the first insulating layer comprises a plasma etching process that includes a combination of plasmas derived from $CF_4$ and $O_2$ gases.

5. The method of claim 1, wherein the first insulating layer comprises a polyimide.

6. The method of claim 1, wherein after etching the first insulating layer, the first insulating layer has a thickness greater than 10 μm.

7. The method of claim 1, wherein the first conductive via has a trapezoid shape, wherein a width of the first conductive via decreases in a direction from the first conductive material towards the first die, and a bottom corner of the first conductive via has an inner angle that is smaller than 90°.

8. A method comprising:

forming a first redistribution structure over a substrate, wherein forming the first redistribution structure comprises:

depositing a first seed layer over a first conductive via and a first insulating layer;

forming a first conductive material on the first seed layer;

forming a mask over the first seed layer and the first conductive material;

forming an opening in the mask that exposes the first conductive material;

forming a second conductive via in the opening;

after forming the second conductive via, depositing a second insulating layer around the second conductive via and the first conductive material, wherein a bottommost surface of the second insulating layer is disposed below a bottommost surface of the second conductive via; and forming a conductive feature over and electrically connected to the second conductive via, wherein the first insulating layer and the second insulating layer each have a respective thickness that is greater than 10 μm.

9. The method of claim 8, wherein the conductive feature has a width that is in a range from 1.2 μm to 12 μm.

10. The method of claim 8, wherein the second conductive via has a trapezoid shape, wherein a topmost surface of the second conductive via has a smaller width than the bottommost surface of the second conductive via, and wherein the topmost surface of the second conductive via is farther away from the substrate than the bottommost surface of the second conductive via.

11. The method of claim 8, wherein the first insulating layer and the second insulating layer comprise a polyimide.

12. The method of claim 8 further comprising:
etching the second insulating layer to expose a top surface of the second conductive via, wherein after etching the second insulating layer a portion of the second conductive via protrudes above a top surface of the second insulating layer.

13. The method of claim 12, wherein a portion of the first conductive via protrudes above a top surface of the first insulating layer.

14. The method of claim 8, wherein widths of the first conductive via and the second conductive via are smaller than 1 μm.

15. A method comprising:
forming a redistribution structure, wherein forming the redistribution structure comprises:
forming a first seed layer over a first conductive via and a first insulating layer;
forming a first conductive material over the first seed layer;
forming a patterned mask over the first seed layer and the first conductive material, wherein an opening in the patterned mask exposes a top surface of the first conductive material;
depositing a second conductive via in the opening;
depositing a second insulating layer around the second conductive via and over the first conductive material; and
performing an etch back process on the second insulating layer to expose a top surface of the second conductive via.

16. The method of claim 15, wherein the first insulating layer and the second insulating layer comprise a polyimide.

17. The method of claim 15, further comprising:
attaching a first die to the redistribution structure using first electrical connectors.

18. The method of claim 15, wherein performing the etch back process comprises performing a plasma etching process using a combination of plasmas derived from $CF_4$ and $O_2$ gases.

19. The method of claim 18, wherein after performing the etch back process, a portion of the second conductive via protrudes above a top surface of the second insulating layer.

20. The method of claim 15, wherein widths of the first conductive via and the second conductive via are smaller than 1 μm.

* * * * *